(12) United States Patent  
Murakami et al.

(10) Patent No.: US 8,879,127 B2
(45) Date of Patent: Nov. 4, 2014

(54) ILLUMINATION APPARATUS, IMAGE SENSOR UNIT, AND PAPER SHEET DISCRIMINATING APPARATUS FOR DISCRIMINATING AN ILLUMINATED BODY

(71) Applicant: Canon Components, Inc., Saitama (JP)

(72) Inventors: Hiroyuki Murakami, Saitama (JP); Kenji Nagata, Saitama (JP); Junya Kinoshita, Saitama (JP)

(73) Assignee: Canon Components, Inc. (JP)

( * ) Notice: Subject to any disclaimer, the term of this patent is extended or adjusted under 35 U.S.C. 154(b) by 0 days.

(21) Appl. No.: 13/855,975

(22) Filed: Apr. 3, 2013

(65) Prior Publication Data

US 2013/0265617 A1 Oct. 10, 2013

(30) Foreign Application Priority Data

Apr. 4, 2012 (JP) ................................. 2012-085853
Mar. 29, 2013 (JP) ................................. 2013-073139

(51) Int. Cl.
| H04N 1/40 | (2006.01) |
| F21V 8/00 | (2006.01) |
| H01L 31/16 | (2006.01) |
| H04N 1/028 | (2006.01) |
| G07D 7/00 | (2006.01) |
| G07D 7/12 | (2006.01) |
| H04N 1/00 | (2006.01) |
| H01L 27/00 | (2006.01) |
| G01D 11/28 | (2006.01) |

(52) U.S. Cl.
CPC .... *G02B 6/0001* (2013.01); *H04N 2201/02495* (2013.01); *H01L 31/16* (2013.01); *H04N 1/02835* (2013.01); *G07D 7/00* (2013.01); *G07D 7/121* (2013.01); *H04N 1/00005* (2013.01); *H04N 1/00525* (2013.01)
USPC ........... 358/448; 358/443; 358/449; 358/453; 358/1.9; 250/208.1; 362/23.12

(58) Field of Classification Search
None
See application file for complete search history.

(56) References Cited

U.S. PATENT DOCUMENTS 5,254,847 A * 10/1993 Hata et al. .................. 250/208.1
5,965,870 A 10/1999 Tabata
6,081,351 A 6/2000 Tabata (Continued)

FOREIGN PATENT DOCUMENTS

| EP | 1843403 A2 | 10/2007 |
| JP | 09-214675 A | 8/1997 |
| JP | 2007-299775 A | 11/2007 |

OTHER PUBLICATIONS

European Search Report issued in European counterpart application No. EP13162075.9, dated Jan. 30, 2014.

*Primary Examiner* — Steven Kau
(74) *Attorney, Agent, or Firm* — Rossi, Kimms & McDowell LLP

(57) ABSTRACT

A first light source and a second light source are arranged so that a protrusion direction of a first terminal from a first supporting body and a protrusion direction of a second terminal from a second supporting body are different when viewed in the longitudinal direction of a light guide. The first light source and the second light source are arranged so as to reduce a protrusion direction of the first supporting body and the second supporting body in a predetermined direction from an area where the first light source and the second light source overlap when viewed in the longitudinal direction of the light guide.

15 Claims, 26 Drawing Sheets

(56) References Cited

U.S. PATENT DOCUMENTS

| | | | |
|---|---|---|---|
| 6,967,751 B2 * | 11/2005 | Nagata | 358/482 |
| 8,218,205 B2 * | 7/2012 | Nagatani et al. | 358/475 |
| 2002/0196617 A1 | 12/2002 | Huang | |
| 2005/0150956 A1 | 7/2005 | Ikeda et al. | |
| 2005/0276064 A1 | 12/2005 | Wu et al. | |
| 2006/0214879 A1 | 9/2006 | Sugimoto et al. | |
| 2007/0165288 A1 | 7/2007 | Ikeno et al. | |
| 2007/0228396 A1 * | 10/2007 | Sumitani | 257/81 |
| 2010/0014315 A1 | 1/2010 | Fujimoto | |
| 2011/0058366 A1 | 3/2011 | Lin et al. | |

* cited by examiner

ILLUMINATION APPARATUS, IMAGE SENSOR UNIT, AND PAPER SHEET DISCRIMINATING APPARATUS FOR DISCRIMINATING AN ILLUMINATED BODY

CROSS-REFERENCE TO RELATED APPLICATIONS

This application is based upon and claims the benefit of priority of the prior Japanese Patent Application No. 2012-085853, filed on Apr. 4, 2012, and the Japanese Patent Application No. 2013-073139, filed on Mar. 29, 2013, the entire contents of which are incorporated herein by reference.

BACKGROUND OF THE INVENTION

1. Field of the Invention

The present invention relates to an illumination apparatus, an image sensor unit, and a paper sheet discriminating apparatus.

2. Description of the Related Art

A light-guide type illumination apparatus is known as an illumination apparatus used in an image sensor unit.

Japanese Laid-open Patent Publication No. 9-214675 discloses a light source unit (illumination apparatus) with LED lamps installed on both end faces of a light guide to obtain more light.

An LED module may be used as a light source of the illumination apparatus, the LED module including LED chips arranged on a light emitting surface of a plate-like supporting body, the LED chips sealed by a transparent resin. In some LED modules, the LED chips are deviated and arranged closer to one side in a width direction relative to a center position of the light emitting surface in the width direction. When the LED modules with the deviated LED chips are set on both end faces of a light guide, there is a problem that the illumination apparatus is enlarged and that the image sensor unit is enlarged accordingly.

LED chips with red, green, blue, as well as infrared and ultraviolet emission wavelengths for example may be used in light sources of an illumination apparatus applied to a paper sheet distinguishing apparatus that authenticates paper sheets, such as bills and securities, in order to read invisible ink for the security. Therefore, the number of lead terminals of the LED module increases, and the LED module is enlarged. As a result, there is a problem that the illumination apparatus and the image sensor unit are further enlarged.

Light sources in different shapes can also be used as LED chips set on both ends of a light guide as in Japanese Laid-open Patent Publication No. 2007-299775. However, if the LED chips in different shapes are used, the cost is greater than when LED chips in the same shape are used at both ends.

FIG. 14 is a perspective view illustrating an arrangement of an illumination apparatus 100 according to a comparative example. The illumination apparatus 100 includes a light guide 101, a first LED module 104, a second LED module 106, and a circuit board 108. The light guide 101 causes light from the first LED module 104 to enter from one of both end faces in a longitudinal direction and causes light from the second LED module 106 to enter from the other end face. The light guide 101 causes a diffusing surface 103 to reflect and diffuse the light entered from both end faces to thereby emit the light to an original from a light emission surface 102.

The first LED module 104 and the second LED module 106 have the same outer shape and structure, have a dimension W in the width direction, and are mounted on the circuit board 108. The first LED module 104 includes an LED chip 105 closer to one side relative to the center position in the width direction, and the second LED module 106 includes an LED chip 107 closer to the same one side relative to the center position in the width direction. Therefore, if the LED chip 105 of the first LED module 104 and the LED chip 107 of the second LED module 106 are mounted on the circuit board 108 facing each other across the light guide 101, the dimension is enlarged in the width direction (sub-scan direction) when viewed in an arrow G direction (main-scan direction).

FIG. 15 is a view from the arrow G direction of FIG. 14. As illustrated in FIG. 15, protrusion lengths of the first LED module 104 and the second LED module 106 in the width direction are long when viewed from the arrow G, because an overlap margin of the two in the width direction is small. Therefore, a dimension T1 of a combination of the first LED module 104 and the second LED module 106 in the width direction is enlarged. In this case, the dimension of the circuit board 108 to be provided with the first LED module 104 and the second LED module 106 also needs to be large in the width direction, and the illumination apparatus 100 is enlarged. This leads to an enlargement of the image sensor unit using the illumination apparatus 100.

SUMMARY OF THE INVENTION

An object of the present invention is to provide an illumination apparatus with a reduced protrusion length in a predetermined direction and to provide an image sensor unit, and a paper sheet discriminating apparatus using the illumination apparatus.

The present invention provides an illumination apparatus that illuminates an illuminated body, the illumination apparatus including: a first light source including: a first light emitting portion that emits light; a first supporting body that supports the first light emitting portion at a position displaced closer to one side; and a first terminal protruding from the first supporting body; a second light source including: a second light emitting portion that emits light; a second supporting body that supports the second light emitting portion at a position displaced closer to the one side that is the same as the first light emitting portion included in the first light source; and a second terminal protruding from the second supporting body in a same direction as a direction of the protrusion of the first terminal from the first supporting body; and a light guide that guides the light from the first light source and the second light source to the illuminated body, wherein the first light source is arranged closer to one end of the light guide in a longitudinal direction so that the first light emitting portion of the first light source is arranged in one end face of the light guide when viewed in the longitudinal direction of the light guide, the second light source is arranged closer to another end of the light guide in the longitudinal direction so that the second light emitting portion of the second light source is arranged in another end face of the light guide when viewed in the longitudinal direction of the light guide, the first light source and the second light source are arranged so that the protrusion direction of the first terminal from the first supporting body and the protrusion direction of the second terminal from the second supporting body are different when viewed in the longitudinal direction of the light guide, and the first light source and the second light source are arranged so that a protrusion length of the first supporting body and the second supporting body in a predetermined direction from an area where the first light source and the second light source overlap when viewed in the longitudinal direction of the light guide is smaller than when the protrusion direction of the first terminal from the first supporting body and the protrusion direction of the second terminal from the second supporting body are the same.

The present invention provides an image sensor unit including: the illumination apparatus; a light condenser that images reflection light from the illuminated body generated by illumination of the illuminated body by the light guide; and an image sensor that receives the light imaged by the light condenser to convert the light to an electric signal.

The present invention provides a paper sheet discriminating apparatus including: the illumination apparatus; an image sensor unit including: a light source that emits light; a light guide that guides the light from the light source to a paper sheet; a light condenser that images reflection light from the paper sheet generated by illumination of a first surface of the paper sheet by the light guide and that images transmitted light that has transmitted through the paper sheet generated by illumination of a second surface of the paper sheet by the illumination apparatus; and an image sensor that receives the light imaged by the light condenser to convert the light to an electric signal; conveying means for conveying the paper sheet; storing means for storing reference data as a reference for discriminating the paper sheet; and discriminating means for comparing image data corresponding to the electric signal with the reference data stored in the storing means to discriminate the paper sheet.

DETAILED DESCRIPTION OF THE PREFERRED EMBODIMENTS

Embodiments of the present invention will now be described in detail with reference to the drawings.

The present embodiments provide an illumination apparatus, a light source unit to which the illumination apparatus is applied, and a paper sheet discriminating apparatus to which the light source unit is applied. In the following description, three-dimensional directions will be indicated by X, Y, and Z arrows. The X direction denotes a main-scan direction, the Y direction denotes a sub-scan direction perpendicular to the main-scan direction, and the Z direction denotes a perpendicular direction (vertical direction).

First Embodiment

In the present embodiment, an illumination apparatus, a light source unit to which the illumination apparatus is applied, and a paper sheet discriminating apparatus to which the light source unit is applied will be described. The paper sheet discriminating apparatus 4 authenticates paper sheets such as bills and securities, and the illumination apparatus emits transmitted light to an original P (illuminated body) as a paper sheet.

Figure 2:
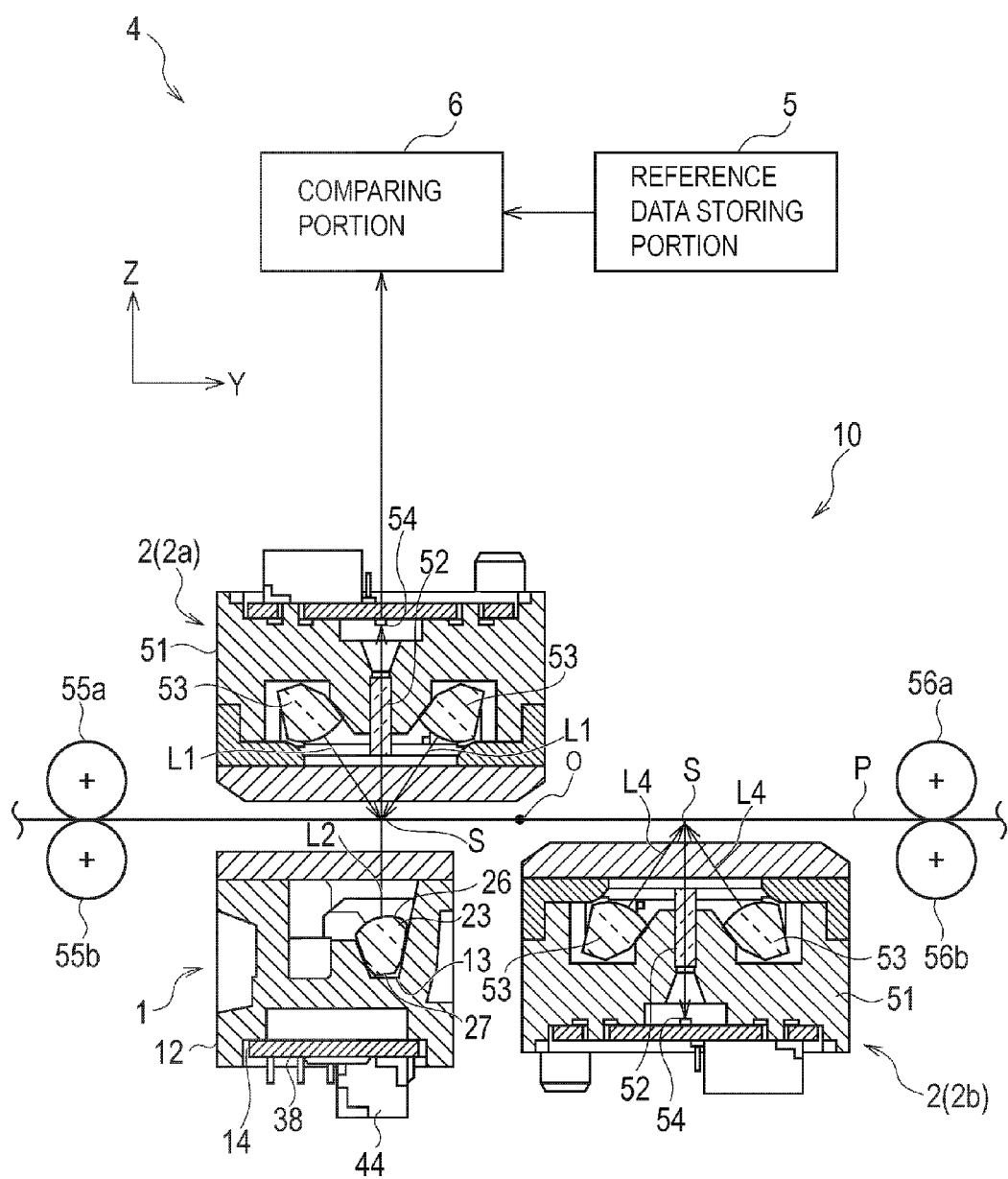
FIG. 2 is a sectional view of a paper sheet discriminating apparatus including the illumination apparatus according to the present embodiments.
Figure 16:
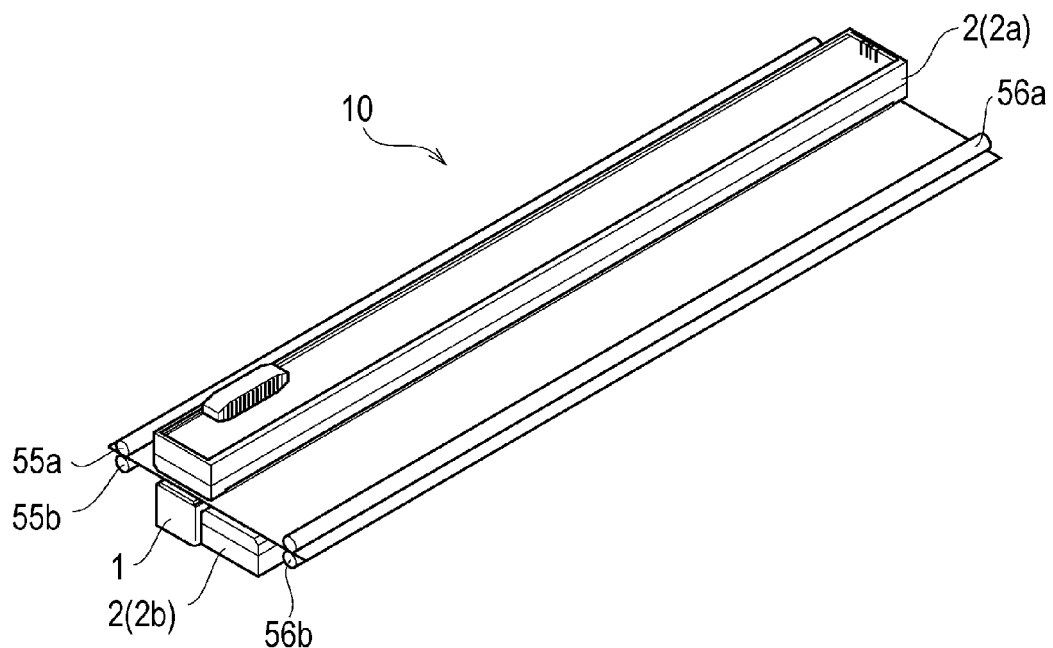
FIG. 16 is a perspective view of a paper sheet reading portion including the illumination apparatus according to the present embodiments.

FIG. 16 is a perspective view of a paper sheet reading portion 10 including a light source unit 1. FIG. 2 is a sectional view illustrating an example of a configuration of the paper sheet discriminating apparatus 4 including the light source unit 1, and the paper sheet discriminating apparatus 4 includes the paper sheet reading portion 10. At predetermined parts of the paper sheet reading portion 10, conveyor rollers 55a and 55b and conveyor rollers 56a and 56b for conveying, in a pair, an original P held therebetween are arranged spaced apart from each other in the sub-scan direction of the original P. A drive mechanism not illustrated rotates and drives the conveyor rollers 55a, 55b, 56a, and 56b, and the original P is conveyed in the sub-scan direction at a predetermined conveyance speed.

The paper sheet reading portion 10 is arranged on a conveyance path of the original P, between the conveyor rollers 55a, 55b and the conveyor rollers 56a, 56b. The paper sheet reading portion 10 reads an image of the conveyed original P. The paper sheet reading portion 10 of the present embodiment includes the light source unit 1 and image sensor units 2 (2a and 2b).

The light source unit 1 emits light for transmission reading to the original P. The light source unit 1 emits the light to the original P from a lower direction.

The image sensor units 2 (2a and 2b) emit light for reflection reading to the original P. The image sensor unit 2a can read reflection light from the original P and transmitted light transmitted through the original P after emission of the light from the light source unit 1 to the original P. The image sensor unit 2a emits light for reflection reading to the original P from an upper direction to read the reflection light from the original P. The image sensor unit 2a reads the transmitted light transmitted through the original P after emission of the light from the light source unit 1. Meanwhile, the image sensor unit 2b emits light for reflection reading to the original P from the lower direction to read reflection light from the original P. The image sensor units 2a and 2b have the same configuration, symmetrically arranged about a center point O.

Basic operation of the light source unit 1 and the image sensor units 2 (2a and 2b) will be described with reference to FIG. 2.

The conveyor rollers 55a and 55b and the conveyor rollers 56a and 56b convey the original P in the sub-scan direction at the predetermined conveyance speed. The image sensor unit 2a turns on the illumination apparatus 100 arranged in a frame 51 to emit light for reflection reading indicated by arrows L1 from a light guide 53 arranged across a condenser 52 to an upper surface of the original P. Therefore, the light is linearly emitted to the original P throughout a reading line S (main-scan direction). The light is reflected by the original P, and the reflection light is imaged on an image sensor 54 through the light condenser 52. The image sensor 54 can convert the imaged reflection light to an electric signal to read the image on the upper surface of the original P.

Having a similar configuration to the image sensor unit 2a, the image sensor unit 2b turns on the illumination apparatus 100 arranged in the frame 51 to emit light for reflection reading indicated by arrows L4 from the light guide 53 arranged across the light condenser 52 to a lower surface of the original P. Therefore, the light is linearly emitted to the original P throughout the reading line S (main-scan direction). The light is reflected by the original P, and the reflection light is imaged on the image sensor 54 through the light condenser 52. The image sensor 54 can convert the imaged reflection light to an electric signal to read the image on the lower surface of the original P.

An illumination apparatus 50 described later arranged in a frame 12 of the light source unit 1 is turned on to emit, from a light guide 23, light for transmission reading indicated by an arrow L2 from the lower direction of the original P. Therefore, the light is linearly emitted to the original P throughout the reading line S (main-scan direction). The light transmits through the original P, and the transmitted light is imaged on the image sensor 54 through the light condenser 52 of the image sensor unit 2a. The image sensor 54 can convert the imaged transmitted light to an electric signal to read the light transmitted through the original P after emission of the light from the lower direction of the original P.

In this way, the image sensor 54 reads the reflection light and the transmitted light of one scan line, and the reading operation of one scan line of the original P in the main-scan direction is completed. After the completion of the reading operation of one scan line, reading operation of the next scan line is performed in the same way as the operation described above, along with movement of the original P in the sub-scan direction. In this way, the reading operation of one scan line is repeated while conveying the original P in the sub-scan direction. The entire surface of the original P is successively scanned, and the image is read based on the reflection light and the transmitted light. As a result, the paper sheet reading portion 10 with the configuration described above can read both upper and lower surfaces of the original P by one conveyance.

The light source unit 1 will be described. The light source unit 1 includes the illumination apparatus 50 provided with a light source on each of both end faces of the light guide 23 as described later. The light source unit 1 is downsized in the sub-scan direction.

Figure 3:
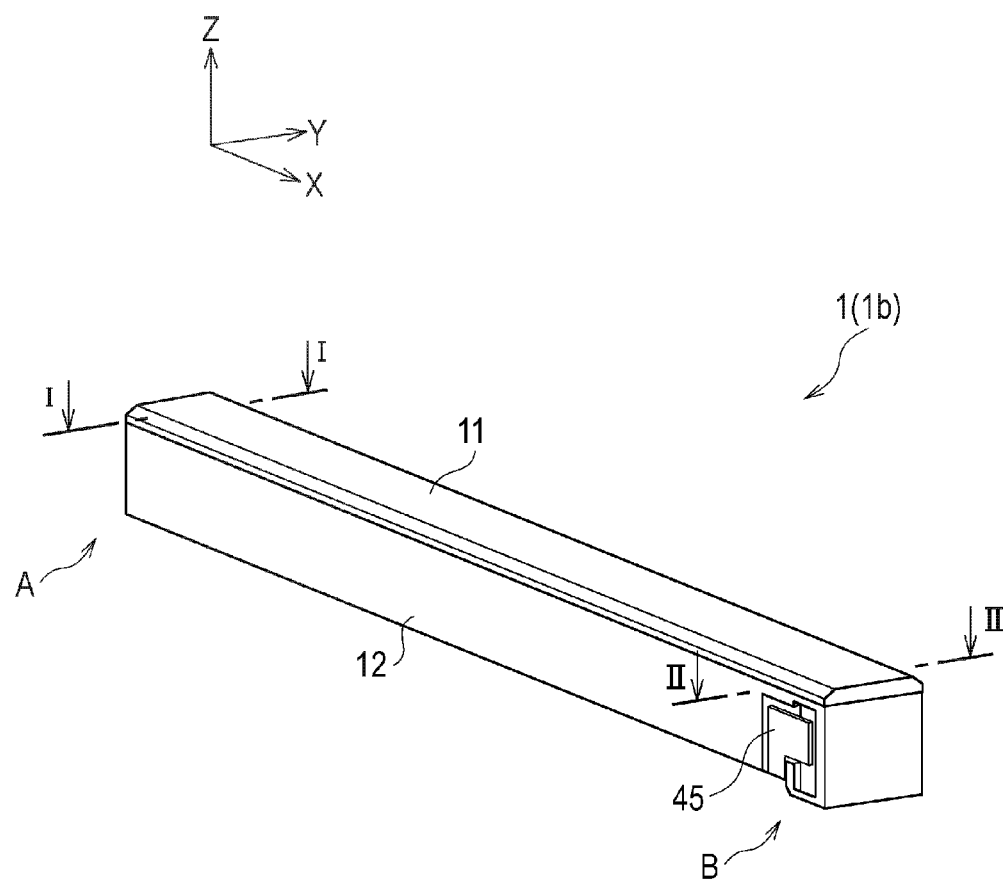
FIG. 3 is a perspective view illustrating an entire configuration of a light source unit according to the present embodiments.
Figure 4:
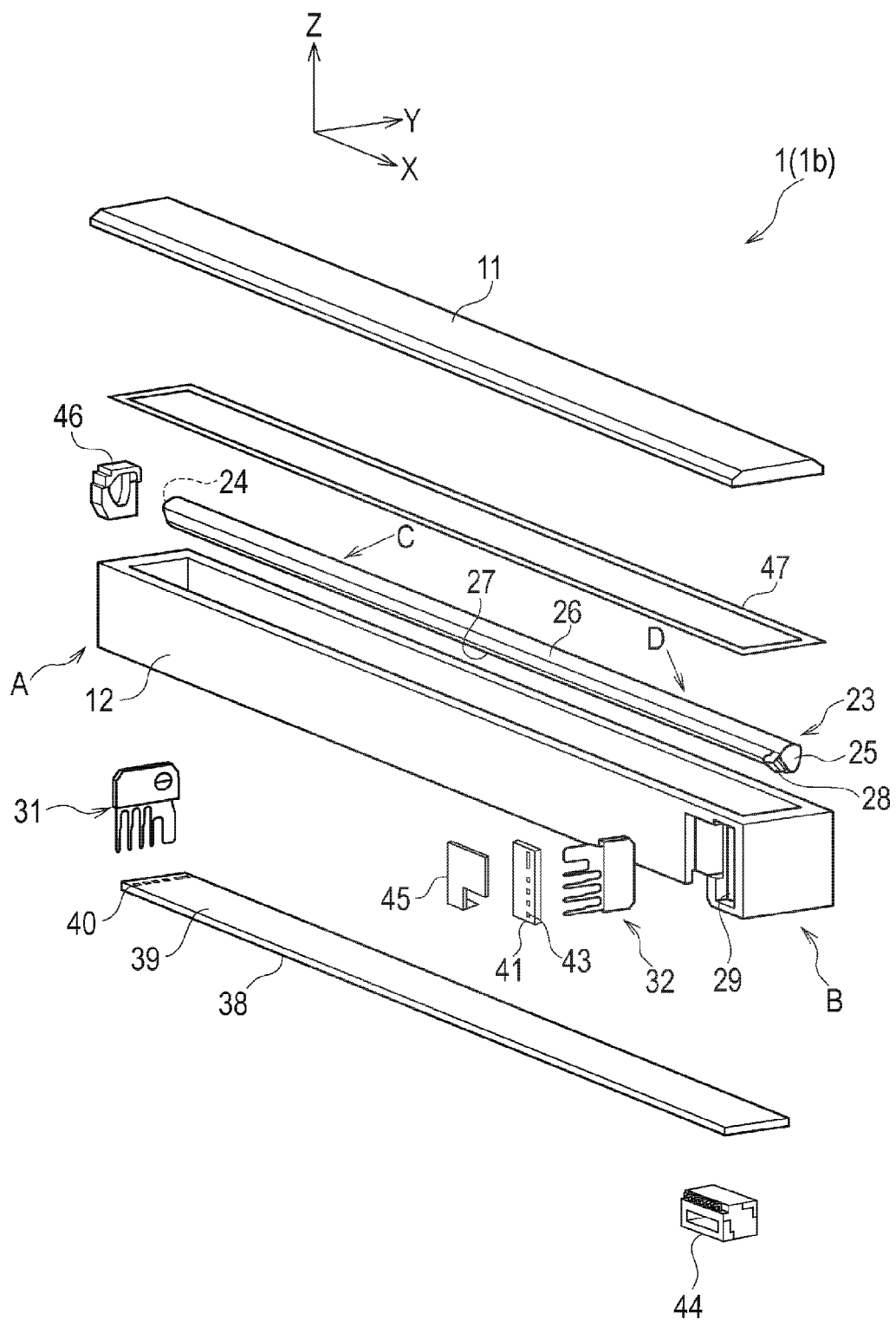
FIG. 4 is an exploded perspective view of the light source unit according to the present embodiments.

A specific configuration of the light source unit 1 will be described with reference to FIG. 2 to FIG. 4. FIG. 3 is a perspective view illustrating an entire configuration of the light source unit 1. FIG. 4 is an exploded perspective view of constituent members of the light source unit 1.

As illustrated in FIG. 3, the light source unit has an external appearance of a substantially rectangular solid, and a longitudinal direction of the light source unit 1 is the main-scan direction. Hereinafter, a side closer to a section A in the main-scan direction of the light source unit 1 illustrated in FIG. 3 will be referred to as a side closer to one end, and a side closer to a section B illustrated in FIG. 3 will be referred to as a side closer to another end.

As illustrated in FIG. 4, the light source unit 1 includes a cover glass 11, the frame 12, the light guide 23, a first light source 31, a second light source 32, a first circuit board 38, a second circuit board 41, a connector 44, a flexible substrate 45, a light blocking member 46, a double-sided tape 47, and the like. Among the constituent members, the light guide 23, the first light source 31, the second light source 32, the first circuit board 38, the second circuit board 41, and the flexible substrate 45 function as the illumination apparatus 50. Among the constituent members, the cover glass 11, the frame 12, the light guide 23, and the first circuit board 38 have lengths according to a width dimension in the main-scan direction of the original P to be read.

The cover glass 11 prevents dust from entering the frame 12. The cover glass 11 has a substantially plate shape, and for example, a double-sided tape 47 is used to fix the cover glass 11 so as to cover the upper direction of the frame 12.

The frame 12 is a housing of the light source unit 1 and is a member that houses the constituent members. The frame 12 is a substantially rectangular solid that is long in the main-scan direction and is formed to be able to position and support the constituent members inside. As illustrated in FIG. 2, a light guide housing portion 13 that houses the light guide 23 is formed in the frame 12 in the main-scan direction. On a lower surface of the frame 12, a first substrate housing portion 14 for arranging the first circuit board 38 is formed in a concave shape from the outside of the frame 12 throughout the main-scan direction. The first circuit board 38 housed in the first substrate housing portion 14 is fixed in the first substrate housing portion 14 by heat caulking, for example.

Figure 5A:
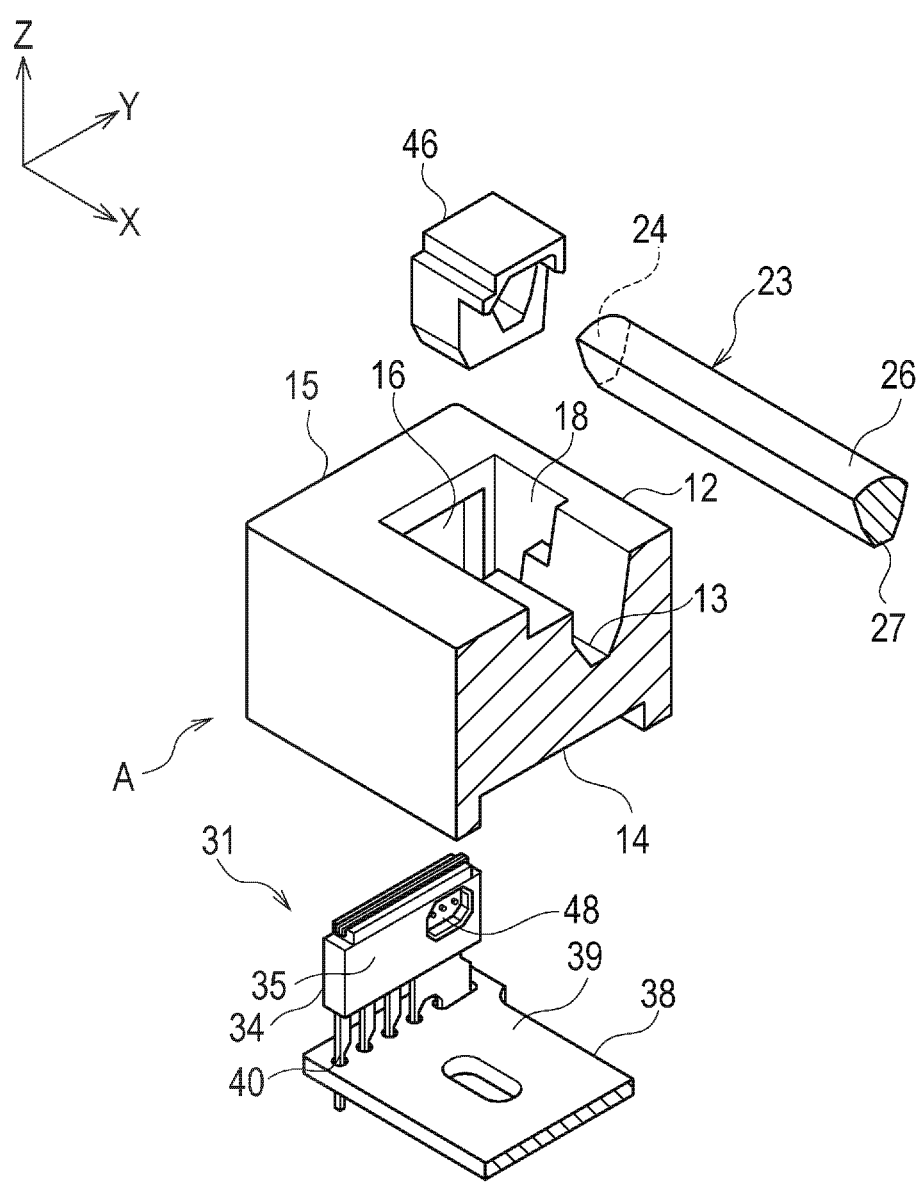
FIG. 5A is a perspective view from an arrow C direction illustrated in FIG. 4.

FIG. 5A is a perspective view of FIG. 4 viewed from an arrow C direction (view from the center and upper direction of the frame 12 toward one side of the frame 12). As illustrated in FIG. 5A, a first light source housing portion 16 that houses the positioned first light source 31 is formed inside of a side wall 15 of the frame 12.

Figure 6A:
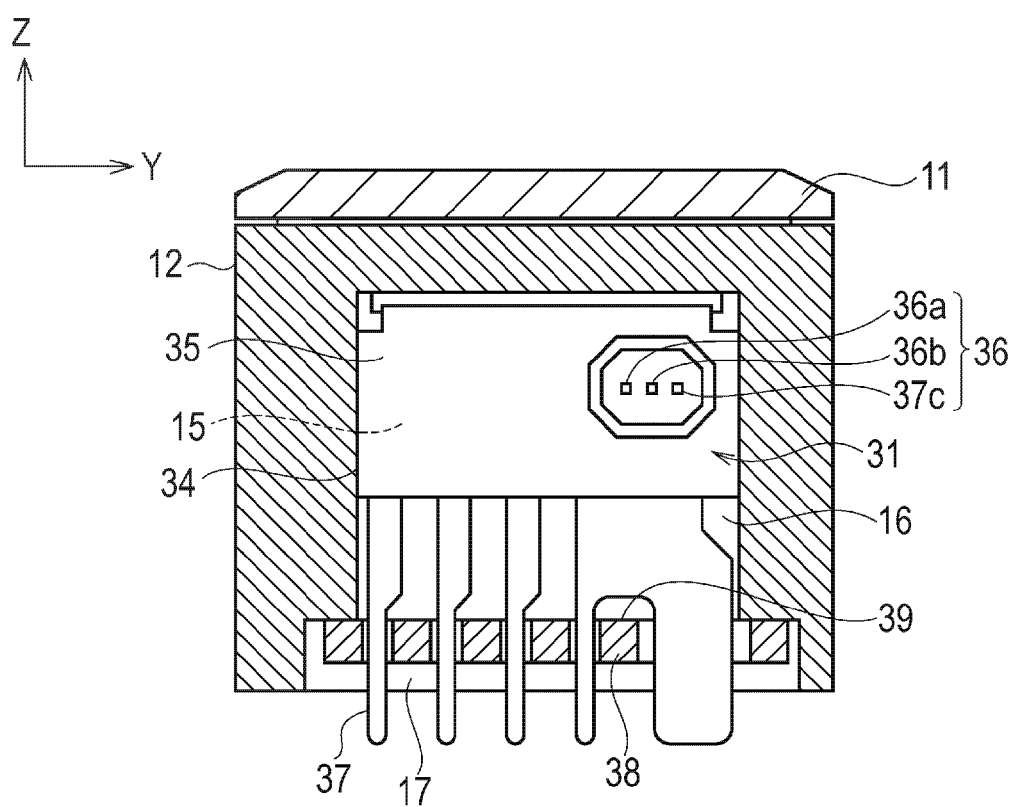
FIG. 6A is a sectional view of a I-I line illustrated in FIG. 3.

FIG. 6A is a sectional view of a cross section of a I-I line illustrated in FIG. 3, viewed from the center of the frame 12. The first light source housing portion 16, formed in a rectangular shape corresponding to the outer shape of the first light source 31, accurately positions the first light source 31 in the sub-scan direction and the vertical direction. An insertion groove 17 is formed in the lower direction of the first light source housing portion 16 to allow inserting the first light source mounted on the first circuit board 38 into the first light source housing portion 16 from the lower direction. As illustrated in FIG. 5A, a light blocking member housing portion 18 for housing the light blocking member 46 is formed at a position adjacent to the first light source housing portion 16 in the main-scan direction.

Figure 5B:
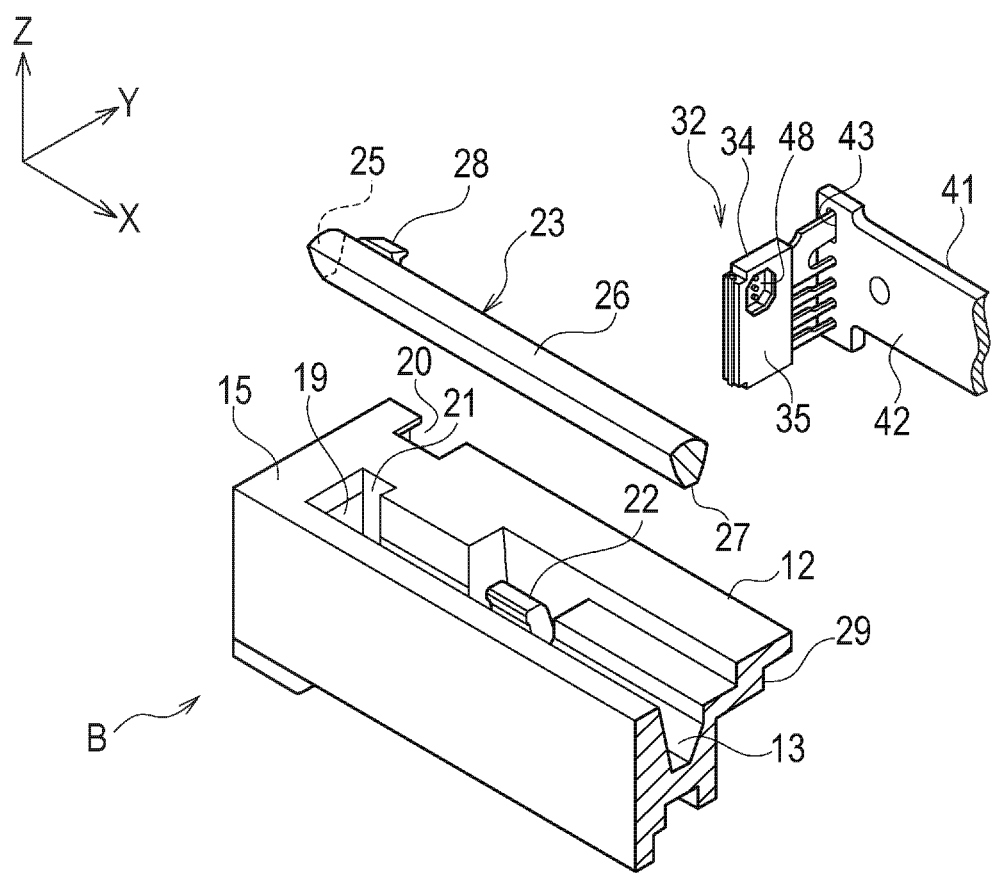
FIG. 5B is a perspective view from an arrow D direction illustrated in FIG. 4.

FIG. 5B is a perspective view of FIG. 4 viewed from an arrow D direction (viewed from the center and upper direction of the frame 12 toward the other side of the frame 12). As illustrated in FIG. 5B, a second light source housing portion 19 that houses the positioned second light source 32 is formed inside of the side wall 15 of the frame 12.

Figure 6B:
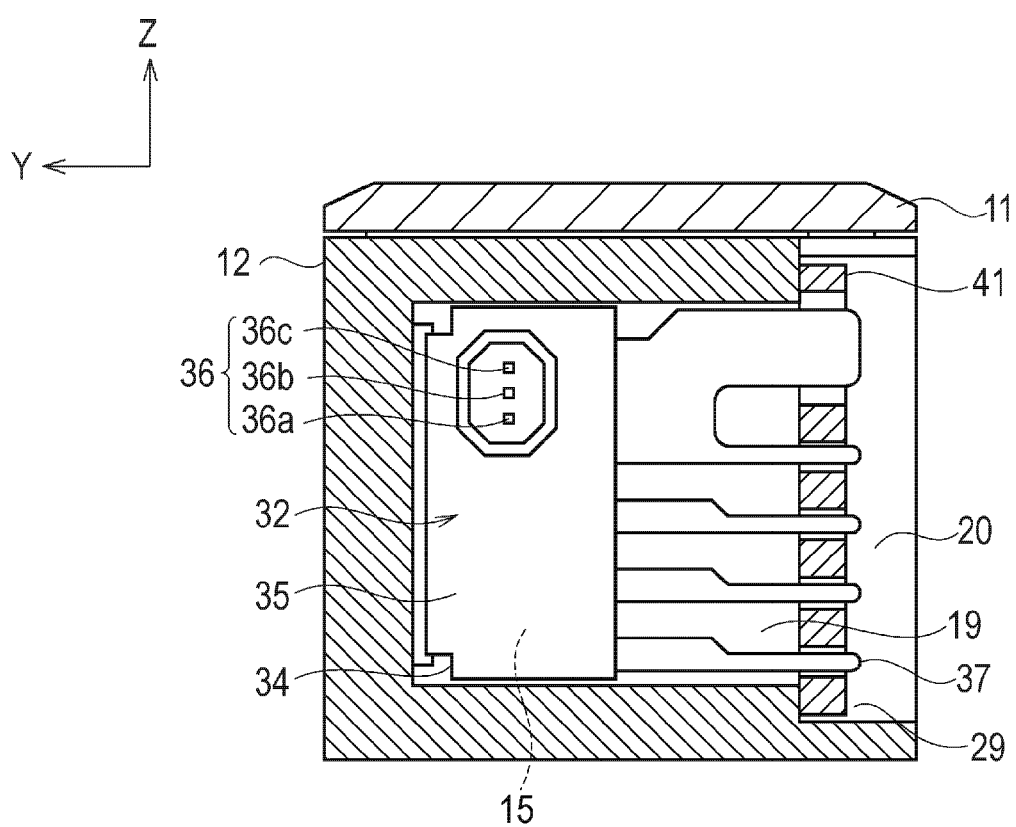
FIG. 6B is a sectional view of a II-II line illustrated in FIG. 3.

FIG. 6B is a sectional view of a cross section of a II-II line illustrated in FIG. 3, viewed from the center of the frame 12 in the main-scan direction. The second light source housing portion 19, formed in a rectangular shape corresponding to the outer shape of the second light source 32, accurately positions the second light source 32 in the sub-scan direction and the vertical direction. An insertion groove 20 is formed on a side of the second light source housing portion 19 to allow inserting the second light source 32 mounted on the second circuit board 41 into the second light source housing portion 19 from the side. As illustrated in FIG. 5B, a second board housing portion 29 for arranging the second circuit board 41 is formed in a concave shape from the outside of the frame 12, adjacent to the insertion groove 20. The second circuit board 41 housed in the second board housing portion 29 is fixed in the second board housing portion 29 by heat caulking, for example. A locking portion 21 for locking a locking claw 28 described later of the light guide 23 is formed at a position adjacent to the second light source housing portion 19 in the main-scan direction. A light guide holding claw 22 that biases the light guide 23 in the sub-scan direction to hold the light guide 23 in the light guide housing portion 13 is further formed on the light guide housing portion 13.

The light guide 23 guides the light emitted from the first light source 31 and the second light source 32 to the original P and has a rod shape in the main-scan direction. The light guide 23 is formed by transparent plastic, such as an acrylic resin and polycarbonate. The light guide 23 is inserted to the light guide housing portion 13 of the frame 12 from the upper direction and is held in the light guide housing portion 13 by the light guide holding claw 22.

In the light guide 23, one of both end faces in the main-scan direction is a first incident surface 24 from which the light from the first light source 31 enters, and the other end face is a second incident surface 25 from which the light from the second light source 32 enters. On a surface facing the original P, the light guide 23 includes a light emission surface 26 for emitting the light incident on the light guide 23 to the original P. On a surface facing the light emission surface 26, the light guide 23 includes a diffusing surface 27 for reflecting and diffusing the light entered from the first incident surface 24 and the second incident surface 25. A light diffusing pattern made of a light reflective paint based on, for example, silk screen printing is formed on the diffusing surface 27. The light entered from the first incident surface 24 and the second incident surface 25 is diffused by the light diffusing pattern and is emitted from the light emission surface 26 to the original P. Surfaces other than the light emission surface 26 and the diffusing surface 27 function as reflection surfaces for reflecting the incident light. At an end of the first incident surface 25, the locking claw 28 to be locked to the locking portion 21 of the frame 12 is formed integrally with the light guide 23.

The first light source 31 and the second light source 32 emit transmitted light to the original P. In the present embodiment, LED modules 33 with the same shape and structure are used for the first light source 31 and the second light source 32.

Figure 7A:
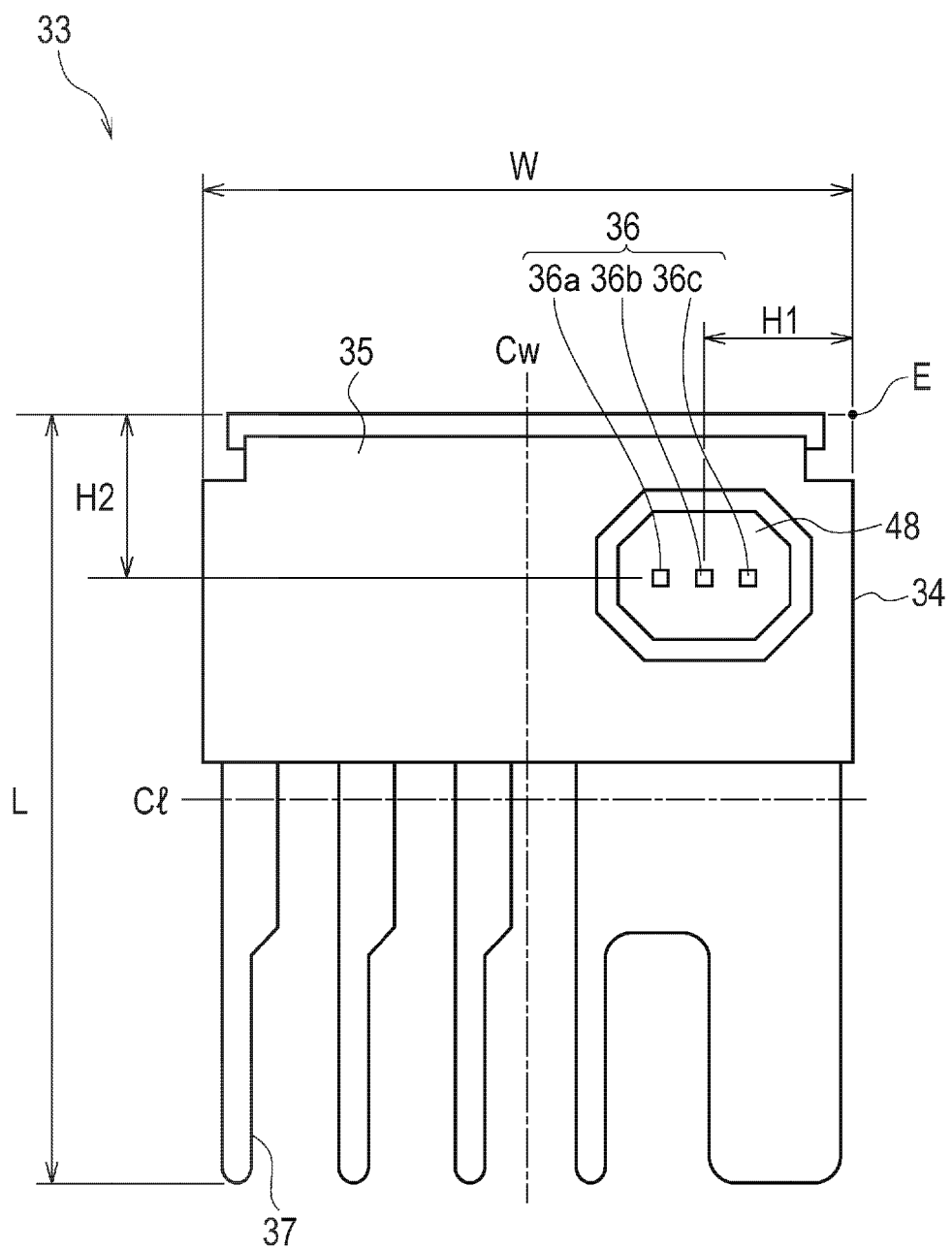
FIG. 7A is a front view of an LED module.
Figure 7B:
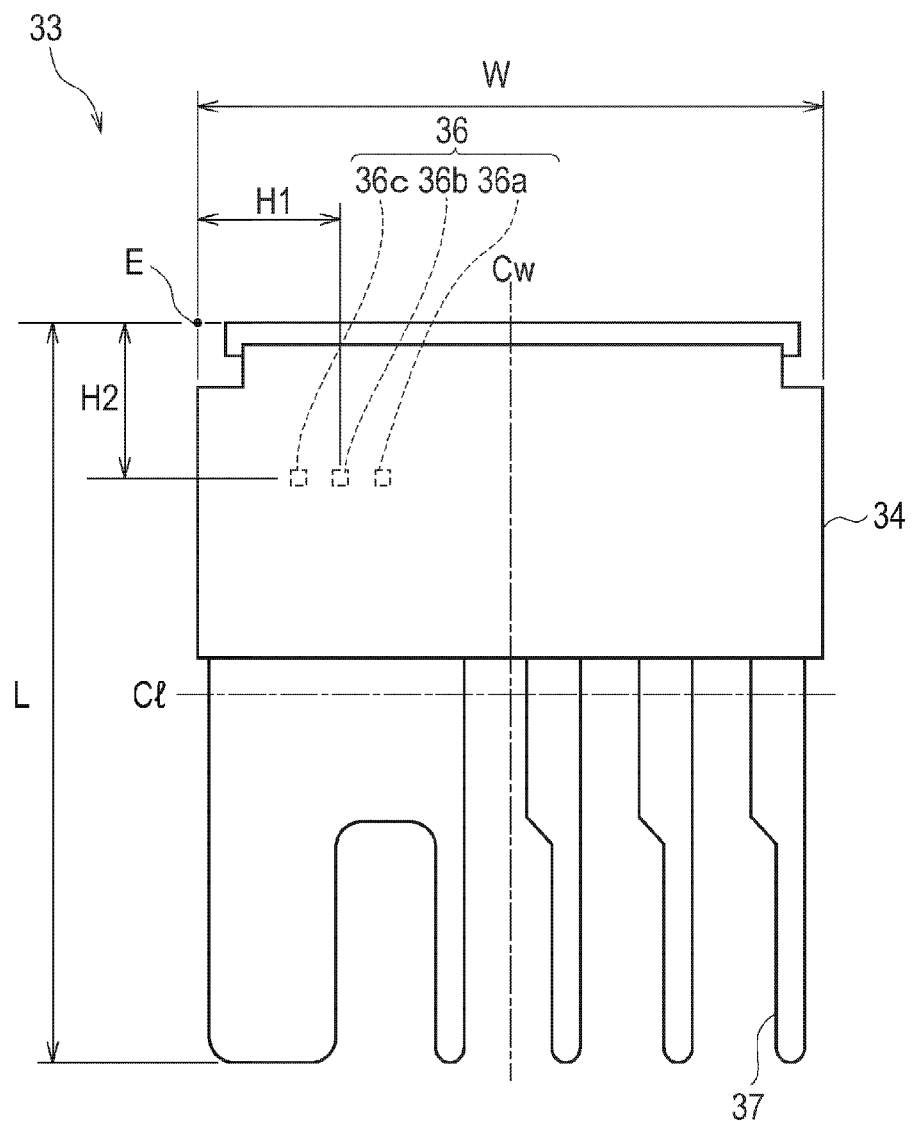
FIG. 7B is a rear view of the LED module.

FIG. 7A and FIG. 7B are views illustrating a configuration of the LED module 33. FIG. 7A is a front view of the LED module 33, and FIG. 7S is a rear view of the LED module 33. The LED module 33 has a dimension W in a width direction and a dimension L in a length direction orthogonal to the width direction. In FIG. 7A and FIG. 7B, a center position of the LED module 33 in the width direction is indicated by Cw, and a center position in the length direction is indicated by C1.

The LED module 33 includes a supporting body 34 formed in a rectangular shape and a plurality of (for example, four) lead terminals 37 protruding from the supporting body 34 in the length direction.

The supporting body 34 includes a flat light emitting surface 35. The light emitting surface 35 is provided with a plurality of (three here) LED chips 36 (36a, 36b, and 36c) as light emitting portions that are sealed by a transparent resin. The LED chips 36a, 36b, and 36c are arranged at constant intervals in the width direction. Therefore, the LED chip 36b is arranged at the center position of the LED chips 36a and 36c.

For example, LED chips with red, green, blue, infrared, and ultraviolet emission wavelengths can be used as the LED chips 36a, 36b, and 36c. The LED chips with infrared and ultraviolet emission wavelengths are used to read the original P applied with invisible ink for the security.

The LED module 33 as the first light source 31 and the LED module 33 as the second light source 32 can have the same or different combination of the LED chips 36. In an example of the different combination of the LED chips 36, the LED chips 36 with red, green, and infrared emission wavelengths are applied to the first light source 31, and the LED chips 36 with red, blue, and infrared emission wavelengths are applied to the second light source 32.

The light emitting portions are provided on a depression 48 depressed in an octagonal shape from the flat light emitting surface 35. The plurality of LED chips 36 (36a, 36b, and 36c) are provided on the depression 48 and sealed by a transparent resin. The coating protection by the transparent resin and the arrangement of the depression 48 can prevent shock to the LED chips 36 or damage of the LED chips 36 caused by collision of the LED chips 36 with other members.

As illustrated in the front view of FIG. 7A, the LED chips 36 are shifted, i.e. deviated, closer to one side (to the right side in FIG. 7A) in the width direction from the center position Cw of the LED module 33 in the width direction. The dimension W of the LED module 33 in the width direction is the same as the dimension of the light emitting surface 35 in the width direction. In other words, the LED chips 36 are deviated closer to one end in the width direction from the center position Cw of the light emitting surface 35 in the width direction. The LED chips 36 are shifted, i.e. deviated, closer to one side (upper side in FIG. 7A) from the center position C1 of the LED module 33 in the length direction. Therefore, the LED chips 36 are arranged close to a corner E among substantially rectangular corners of the supporting body 34. The corner E denotes an apex derived by supplying lines to the shape of the supporting body 34 to express the shape by an accurate rectangle. As illustrated in FIG. 7A, the LED chip 36b at the center position of the LED chips 36 is separated from the corner E by a distance H1 in the width direction and is separated from the corner E by a distance H2 in the length direction. In the present embodiment, the dimensions of the distance H1 and the distance H2 are the same. In the rear view of FIG. 7B, the LED chips 36 are similarly arranged close to the corner E of the supporting body 34. The LED chip 36b is separated from the corner E by the distance H1 in the width direction and is separated from the corner E by the distance H2 in the length direction.

Figure 19:
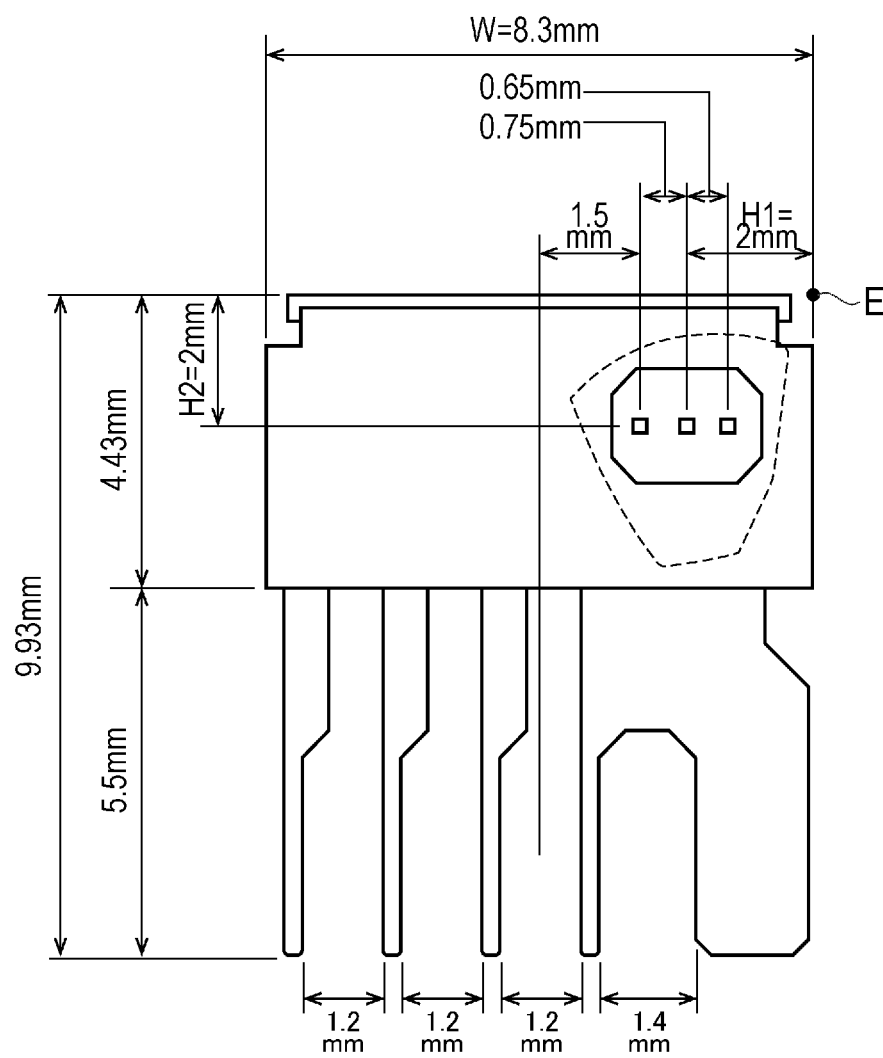
FIG. 19 is a front view illustrating lengths of portions of the LED module.

FIG. 19 is a front view illustrating lengths of the portions of the LED module according to the present embodiment. In the present embodiment, the dimension W of the LED module 33 in the width direction is 8.3 (mm), and the distance H1 separated from the corner E in the width direction and the distance H2 separated from the corner E in the length direction are 2 (mm). The dimension of the supporting body in the length direction is 4.43 (mm), and the dimension of the terminal in the length direction is 5.5 (mm).

In the present embodiment, the first light source 31 is mounted on the first circuit board 38, and the second light source 32 is mounted on the second circuit board 41, instead of mounting the first light source 31 and the second light source 32 on one circuit board.

The first circuit board 38 is formed in a plate shape with the main-scan direction as a longitudinal direction. A mounting surface 39 of the first circuit board 38 is orthogonal to the vertical direction. A drive circuit not illustrated for emitting the first light source 31 is mounted on the mounting surface 39 of the first circuit board 38. Insertion holes 40, to which the lead terminals 37 of the LED module 33 are inserted, are formed closer to one end of the first circuit board 38. When the LED module 33 is mounted on the first circuit board 38, the light emitting surface 35 of the LED module 33 is orthogonal to the main-scan direction and faces the first incident surface 24 of the light guide 23. In this case, the width direction of the LED module 33 coincides with the sub-scan direction.

The second circuit board 41 is smaller than the first circuit board 38 and is formed in a plate shape in the main-scan direction. A mounting surface 42 of the second circuit board 41 is orthogonal to the sub-scan direction. More specifically, the mounting surface 42 of the second circuit board 41 is arranged orthogonal to the mounting surface 39 of the first circuit board 38. A drive circuit not illustrated for emitting the second light source 32 is mounted on the mounting surface 42 of the second circuit board 41. Insertion holes 43, to which the lead terminals 37 of the LED module 33 are inserted, are formed on the second circuit board 41. When the LED module 33 is mounted on the second circuit board 41, the light emitting surface 35 of the LED module 33 is orthogonal to the main-scan direction and faces the second incident surface 25 of the light guide 23. In this case, the width direction of the LED module 33 corresponds to the vertical direction and is rotated 90° relative to the width direction of the first LED module.

The connector 44 is for connecting the light source unit 1 with other apparatuses to allow transmission and reception of power or electric signals. The connector 44 is attached to a lower surface of the first circuit board 38.

The flexible substrate 45 connects the first circuit board 38 and the second circuit board 41 to allow transmission and reception of power or electric signals. The first circuit board 38 and the second circuit board 41 can be electrically connected through the flexible substrate 45 to control timing of turning on the LED chips 36 of the first light source 31 and the second light source 32.

The light blocking member 46 includes a space in substantially the same shape as the cross-sectional shape of the light guide 23 viewed from the main-scan direction. The light blocking member 46 can cover the outer periphery of the light guide 23 closer to the first incident surface 24 to block leak light emitted from the first light source 31 from a gap between the first light source 31 and the first incident surface 24 of the light guide 23. The light blocking member 46 is put into the light blocking member housing portion 18 of the frame 12 from above while being inserted to the light guide 23 closer to one end. In this way, the light blocking member 46 is positioned relative to the frame 12.

Figure 1:
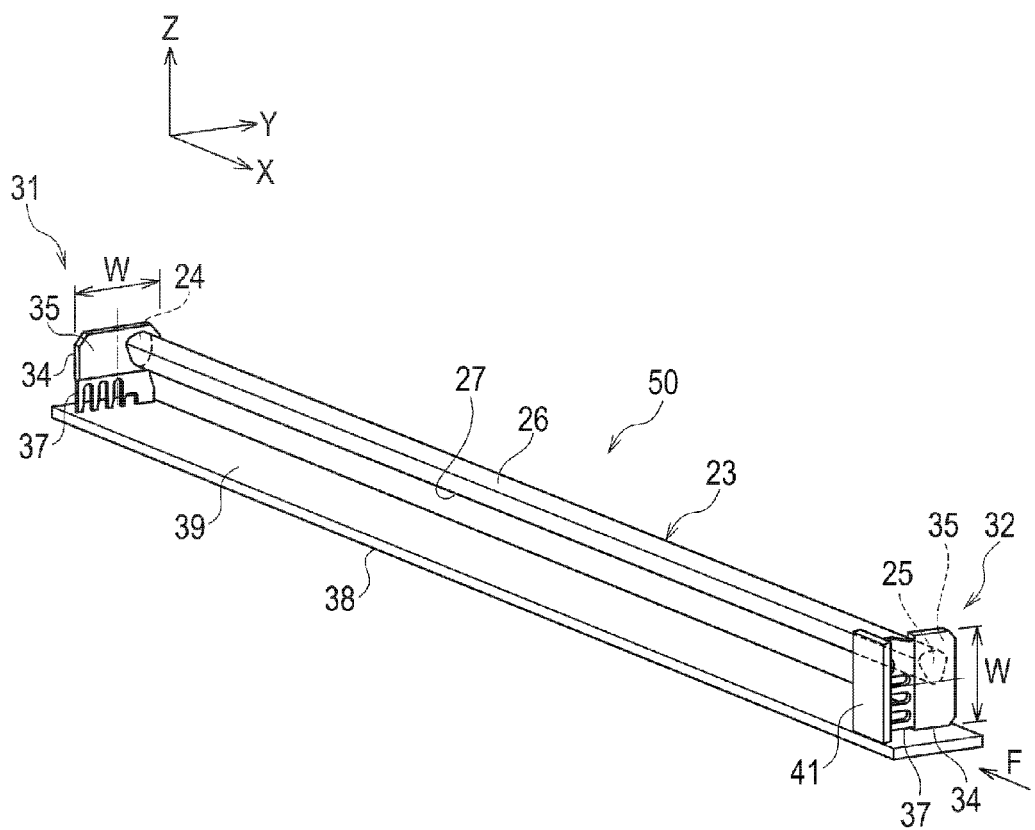
FIG. 1 is a perspective view illustrating an arrangement of an illumination apparatus according to the present embodiments.

Arrangements of the constituent members when the light source unit 1 is assembled will be described with reference to FIG. 1 and FIG. 8. FIG. 1 is a perspective view illustrating an arrangement of the light guide 23, the first light source 31, the second light source 32, the first circuit board 38, and the second circuit board 41.

When the light source unit 1 is assembled, the first light source 31 and the second light source 32 are set on both end faces of the light guide 23 in the main-scan direction as illustrated in FIG. 1. Specifically, the light emitting surface 35 of the first light source 31 faces the first incident surface 24 of the light guide 23 at a predetermined interval. In this case, the width direction of the first light source 31 is arranged in the sub-scan direction. More specifically, the width direction of the light emitting surface 35 coincides with the sub-scan direction of the first light source 31, and the direction of the protrusion of the lead terminals 37 from the supporting body 34 coincides with the vertical direction. The light emitting surface 35 of the second light source 32 faces the second incident surface 25 of the light guide 23 at a predetermined interval. In this case, the width direction of the second light source 32 is arranged in the vertical direction orthogonal to the sub-scan direction. More specifically, the width direction of the light emitting surface 35 of the second light source 32 coincides with the vertical direction, and the direction of the protrusion of the lead terminals 37 from the supporting body 34 coincides with the sub-scan direction.

When two LED modules 33 in the same configuration including the LED chips 36 deviated and arranged closer to one side of the light emitting surface 35 in the width direction are set on both end faces of the light guide 23, the protrusion length in the sub-scan direction is enlarged if the width directions of the LED modules 33 are the same direction, as in the light source unit according to the comparative example. Therefore, the dimension of the combination of the first light source and the second light source in the sub-scan direction is enlarged.

Therefore, the width direction of the LED module 33 of the first light source 31 is set to the sub-scan direction in the present embodiment, and the width direction of the LED module 33 of the second light source 32 is set to the vertical direction orthogonal to the sub-scan direction in assembling the light source unit 1. This increases the overlap margin of the first light source and the second light source. Therefore, the protrusion length in the sub-scan direction is reduced, and the dimension of the combination of the first light source 31 and the second light source 32 in the sub-scan direction can be reduced.

Figure 8:
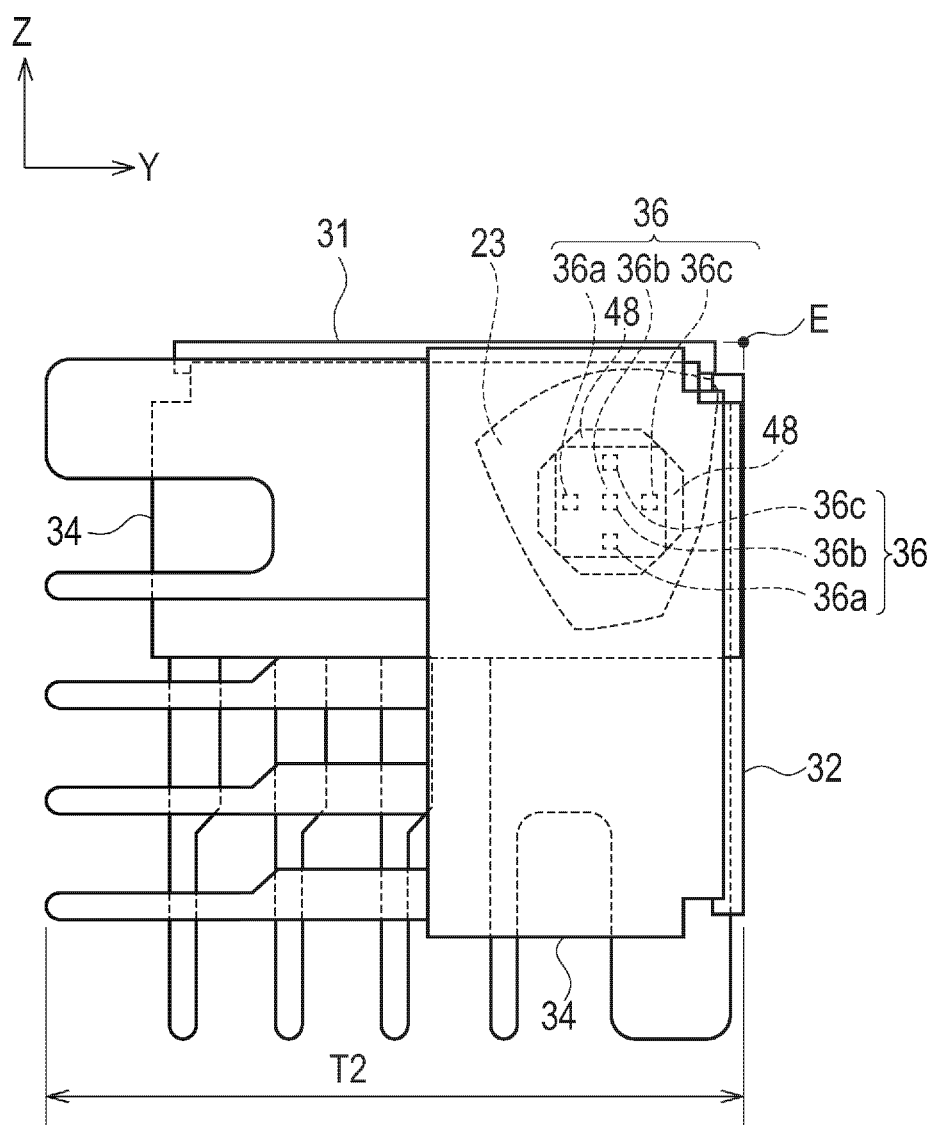
FIG. 8 is a view from an arrow F direction illustrated in FIG. 1.

FIG. 8 is a view from an arrow F direction (main-scan direction) of FIG. 1. As illustrated in FIG. 8, the LED chips 36 of the first light source 31 and the LED chips 36 of the second light source 32 can face the first incident surface 24 and the second incident surface 25 of the light guide 23. In the present embodiment, the LED chips 36 of the first light source 31 are arranged in the first incident surface 24 of the light guide 23 when viewed in the main-scan direction. The depression 48 of the light emitting surface 35 of the first light source 31 is arranged in the first incident surface 24 when viewed in the main-scan direction. In the present embodiment, the LED chips 36 of the second light source 32 are arranged in the second incident surface 25 of the light guide 23 when viewed in the main-scan direction. The depression 48 of the light emitting surface 35 of the second light source 32 is arranged in the second incident surface 25 when viewed in the main-scan direction.

In the present embodiment, the LED chip 36b at the center position of the LED chips 36 of the first light source 31 and the LED chip 36b at the center position of the LED chips 36 of the second light source 32 overlap in the main-scan direction. As described, the LED chip 36b is separated from the corner E by the distance H1 in the width direction and separated from the corner E by the distance H2 in the length direction in the present embodiment. Since the distance H1 and the distance H2 have the same dimension, the corner E of the first light source 31 and the corner E of the second light source 32 are set to overlap in the main-scan direction as illustrated in FIG. 8.

Figure 15:
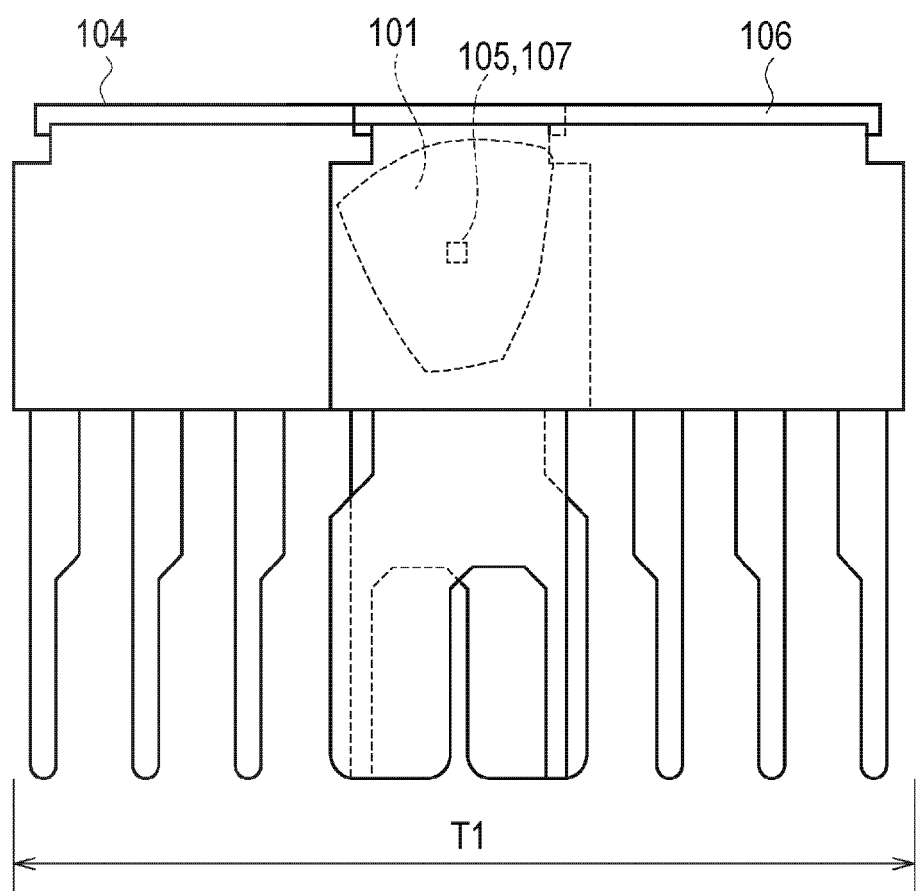
FIG. 15 is a view from an arrow G direction illustrated in FIG. 14.

The first light source 31 and the second light source 32 can be set so that the width directions of the light emitting surfaces 35 are orthogonal to each other. In this way, the protrusion lengths of the first light source 31 and the second light source 32 in the sub-scan direction when viewed in the main-scan direction can be reduced. Therefore, the dimension of the combination of the first light source 31 and the second light source 32 in the sub-scan direction can be reduced. A dimension T2 in the sub-scan direction according to the present embodiment can be substantially ¾ of the dimension T1 in the sub-scan direction illustrated in FIG. 15 according to the comparative example. The reduction of the dimension of the combination of the first light source 31 and the second light source 32 in the sub-scan direction can reduce the dimension of the frame 12 in the sub-scan direction and can downsize the light source unit 1.

According to the light source unit 1 of the present embodiment, the first light source 31 and the second light source 32 can be set so that the width directions of the light emitting surfaces are orthogonal to each other when viewed in the longitudinal direction of the light guide 23. In this way, the dimension of the combination of the first light source 31 and the second light source 32 in the sub-scan direction when viewed in the main-scan direction can be reduced. Therefore, the light source unit 1 and the paper sheet reading portion 10 can be downsized.

Figure 20:
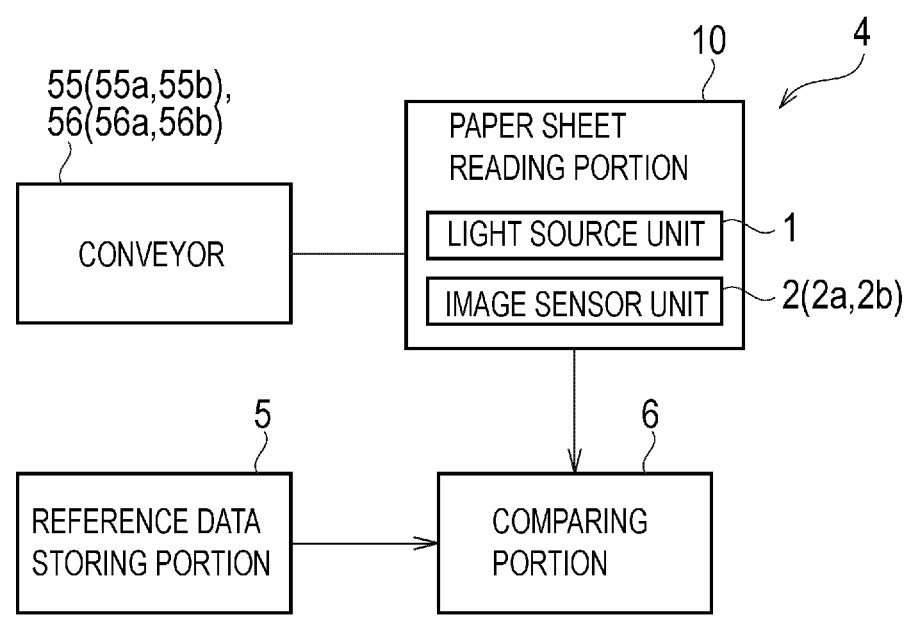
FIG. 20 is a view illustrating a configuration of a paper sheet discriminating apparatus.
Figure 21:
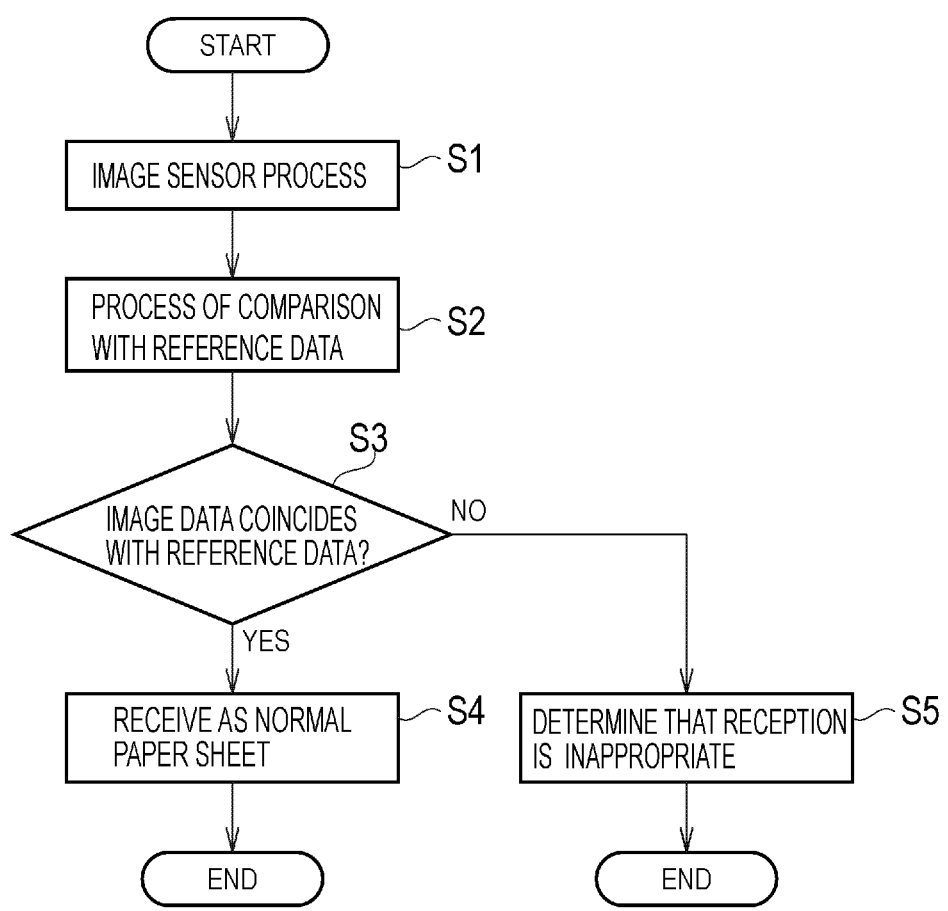
FIG. 21 is a flow chart of a discrimination process of a paper sheet.

The paper sheet discriminating apparatus 4 provided with the paper sheet reading portion 10 including the light source unit 1 according to the first embodiment will be described with reference to FIG. 20 and FIG. 21. The paper sheet discriminating apparatus 4 includes: the paper sheet reading portion that reads transmitted light and reflection light from a paper sheet as an illuminated body; a reference data storing portion 5 that stores reference data as a reference for discriminating the paper sheet; and a comparing portion 6 that compares image data according to an electric signal from the paper sheet reading portion 10 with the reference data.

In the paper sheet discriminating apparatus 4, the conveyor rollers 55 (55a and 55b) and 56 (56a and 56b) as conveying means convey a paper sheet P as an illuminated body, the light source unit 1 emits light to the paper sheet P, and a photoelectric conversion element arranged on the image sensor unit 2a opposed across the paper sheet P converts transmitted light to an electric signal (S1). The image sensor units 2 (2a and 2b) further emit light to the paper sheet P as an illuminated body, and the photoelectric conversion element converts reflection light from the paper sheet P to an electric signal (S1). The comparing portion 6 compares image data obtained by the image sensor with the reference data stored in the reference data storing portion 5 (S2) and determines whether the data coincide (S3). If the data coincide, the comparing portion 6 determines that the paper sheet is normal and receives the paper sheet (S4). On the other hand, if the data do not coincide, the comparing portion 6 determines that the paper sheet is not normal and determines that reception is inappropriate (S5).

Second Embodiment

In the present embodiment, an image sensor unit including the illumination apparatus 50 according to the first embodiment as well as an image reading apparatus and an image forming apparatus to which the image sensor unit is applied will be described. In the image reading apparatus and the image forming apparatus, the illumination apparatus 50 emits light to the original P as an illuminated body, and the image sensor unit including the illumination apparatus 50 converts reflection light to an electric signal to read an image.

Figure 9:
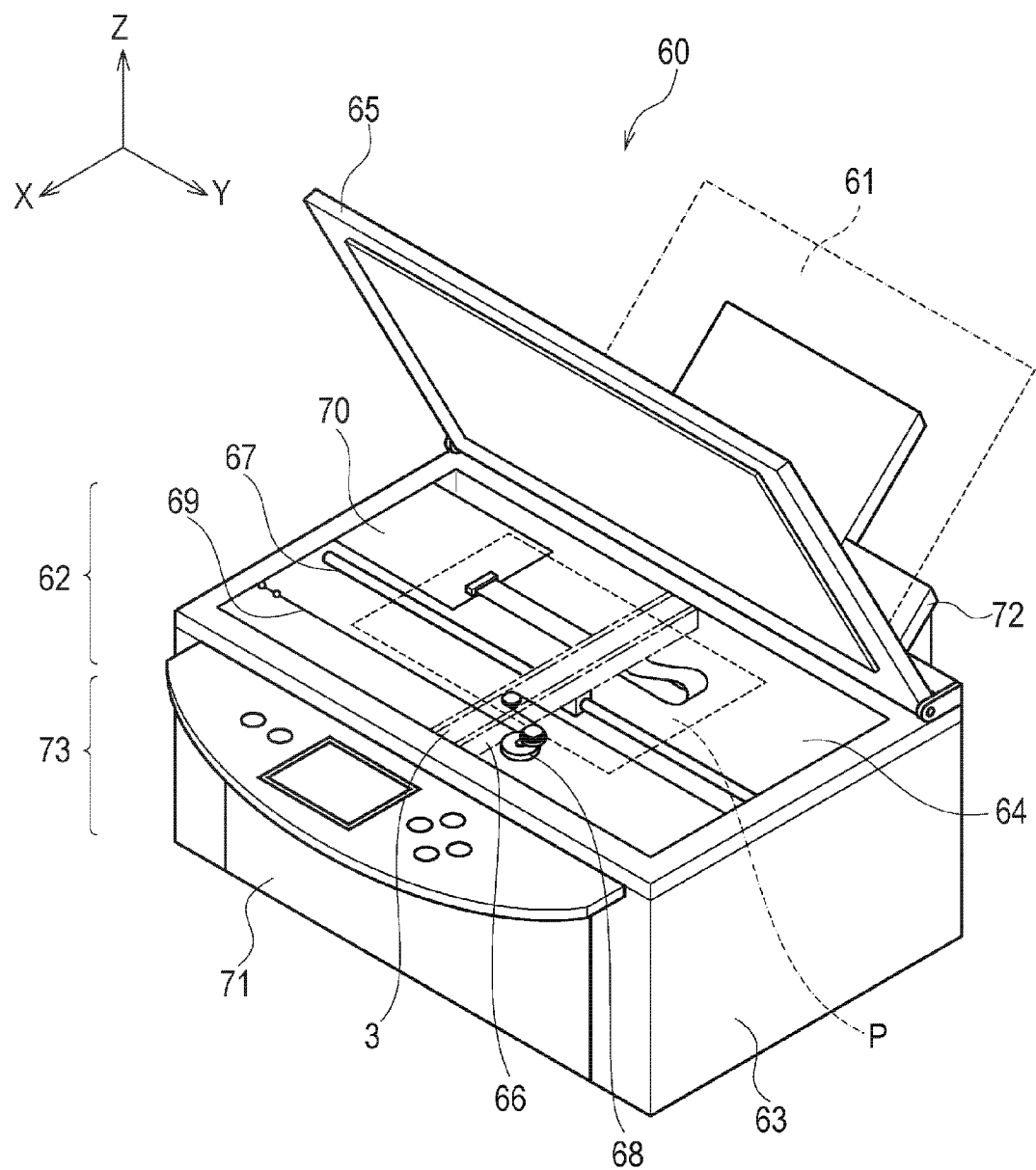
FIG. 9 is a perspective view illustrating an image reading apparatus and an image forming apparatus according to the present embodiments.

A multifunction printer (MFP) as an image reading apparatus or an image forming apparatus, to which the image sensor unit according to the present embodiment can be applied, will be described with reference to FIG. 9. FIG. 9 is a perspective view illustrating an appearance of the MFP. As illustrated in FIG. 9, the MFP 60 includes: an image reading portion 62 as image reading means for reading reflection light from the original P as an illuminated body; and an image forming portion 73 as image forming means for forming (printing) an image of the original P on a sheet 61 (recording paper) as a recording medium.

The image reading portion 62 has a function of a so-called image scanner and has the following configuration, for example. The image reading portion 62 includes: a housing 63; a platen glass 64 as an original placing portion made of a glass transparent plate; and a platen cover 65 that can be freely opened and closed relative to the housing 63 so as to be able to cover the original P.

The house 63 houses an image sensor unit 3 including the illumination apparatus 50, a holding member 66, an image sensor unit slide shaft 67, an image sensor unit drive motor 68, a wire 69, a signal processing portion 70, a recovery unit 71, a paper feeding tray 72, and the like.

The image sensor unit 3 is a contact image sensor (CIS) unit, for example. The holding member 66 surrounds and holds the image sensor unit 3. The image sensor unit slide shaft 67 guides the holding member 66 in the sub-scan direction along the platen glass 64. The image sensor unit drive motor 68 moves the wire 69 attached to the holding member 66. The recovery unit 71, which can be freely opened and closed relative to the housing 63, recovers the printed sheet 61. The paper feeding tray 72 houses the sheet 61 in a predetermined size.

In the image reading portion 62 with the configuration, the image sensor unit drive motor 68 moves the image sensor unit 3 in the sub-scan direction along the image sensor unit slide shaft 67. In this case, the image sensor unit 3 optically reads the original P placed on the platen glass 64 to convert the light to an electric signal to perform reading operation of the image.

Figure 10:
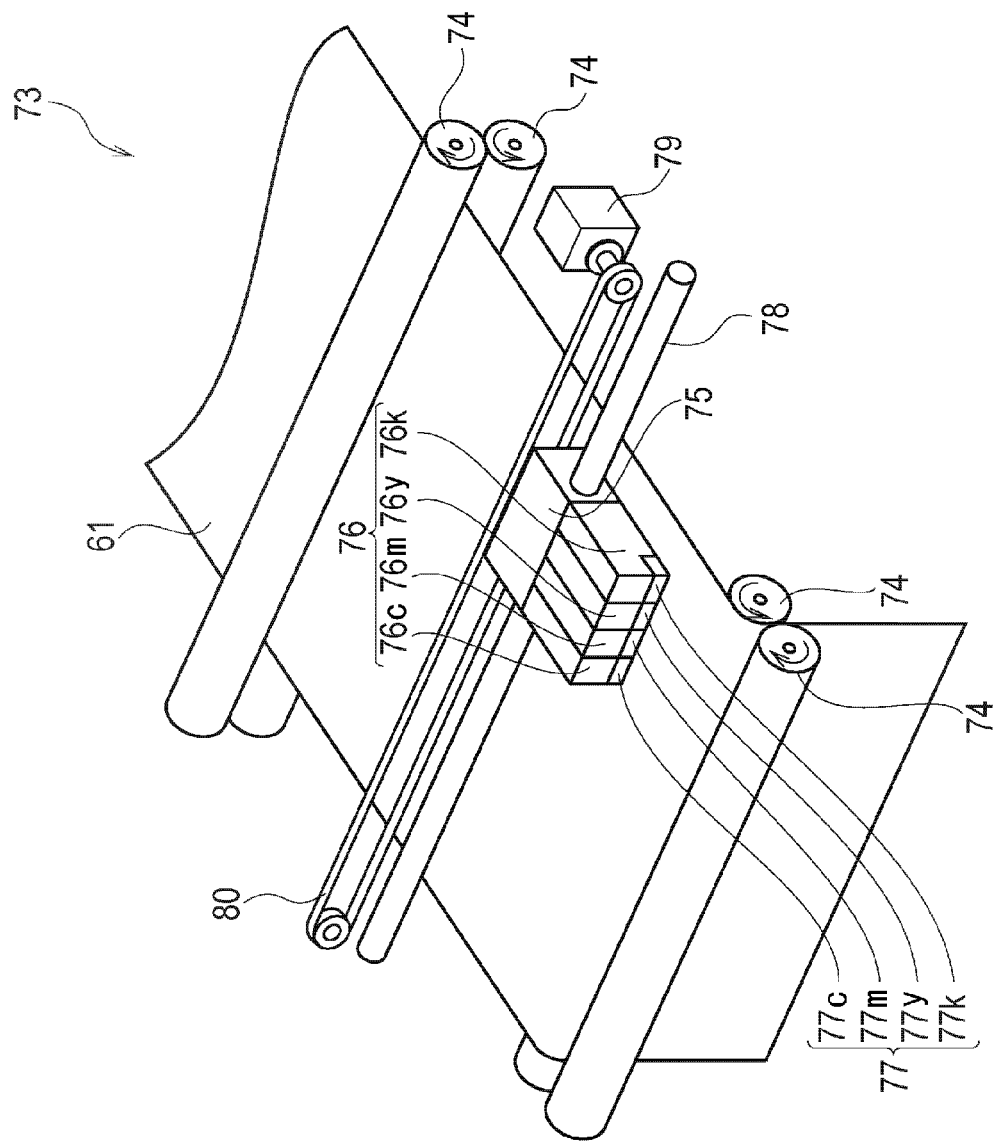
FIG. 10 is a schematic view illustrating a structure of an image forming portion according to the present embodiments.

FIG. 10 is a schematic view illustrating a structure of the image forming portion 73.

The image forming portion 73 has a function of a so-called printer and has the following configuration, for example. The image forming portion 73, housed in the housing 63, includes conveyance rolls 74 and a recording head 75 as illustrated in FIG. 10. The recording head 75 includes, for example: ink tanks 76 (76c, 76m, 76y, and 76k) with cyan C, magenta M, yellow X, and black K inks; and discharge heads 77 (77c, 77m, 77y, and 77k) provided to the ink tanks 76, respectively. The image forming portion 73 includes a recording head slide shaft 78, a recording head drive motor 79, and a belt 80 attached to the recording head 75.

In the image forming portion 73 with the configuration described above, the conveyance rolls 74 convey the sheet 61 supplied from the paper feeding tray 72 to the recording position. The recording head drive motor 79 mechanically moves the belt 80, and the recording head 75 performs printing on the sheet 61 based on an electric signal while moving in a printing direction (main-scan direction) along the recording head slide shaft 78. The operation is repeated until the printing is finished, and the conveyance rolls 74 eject the printed sheet 61 to the recovery unit 71.

Although the image forming apparatus of an inkjet type has been described as the image forming portion 73, the type can be any type, such as an electrophotographic type, a thermal transfer type, and a dot impact type.

The image sensor unit 3 of the present embodiment will be described. The image sensor unit 3 of the present embodiment includes a light condenser and an image sensor added to the illumination apparatus 50 of the first embodiment and is configured to emit light for reflection reading to the original P and to read reflection light from the original P. Other than the addition of the light condenser and the image sensor unit, the configuration is the same as the configuration of the light source unit 1 according to the first embodiment. The same reference numerals are provided, and the description will not be repeated.

Figure 11:
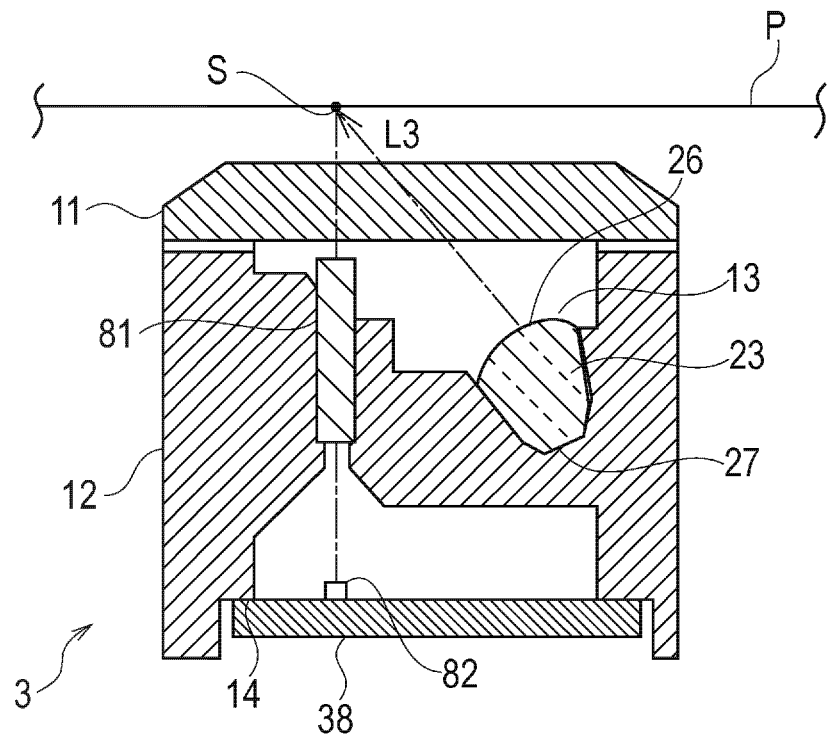
FIG. 11 is a sectional view of an image sensor unit according to the present embodiments.
Figure 12:
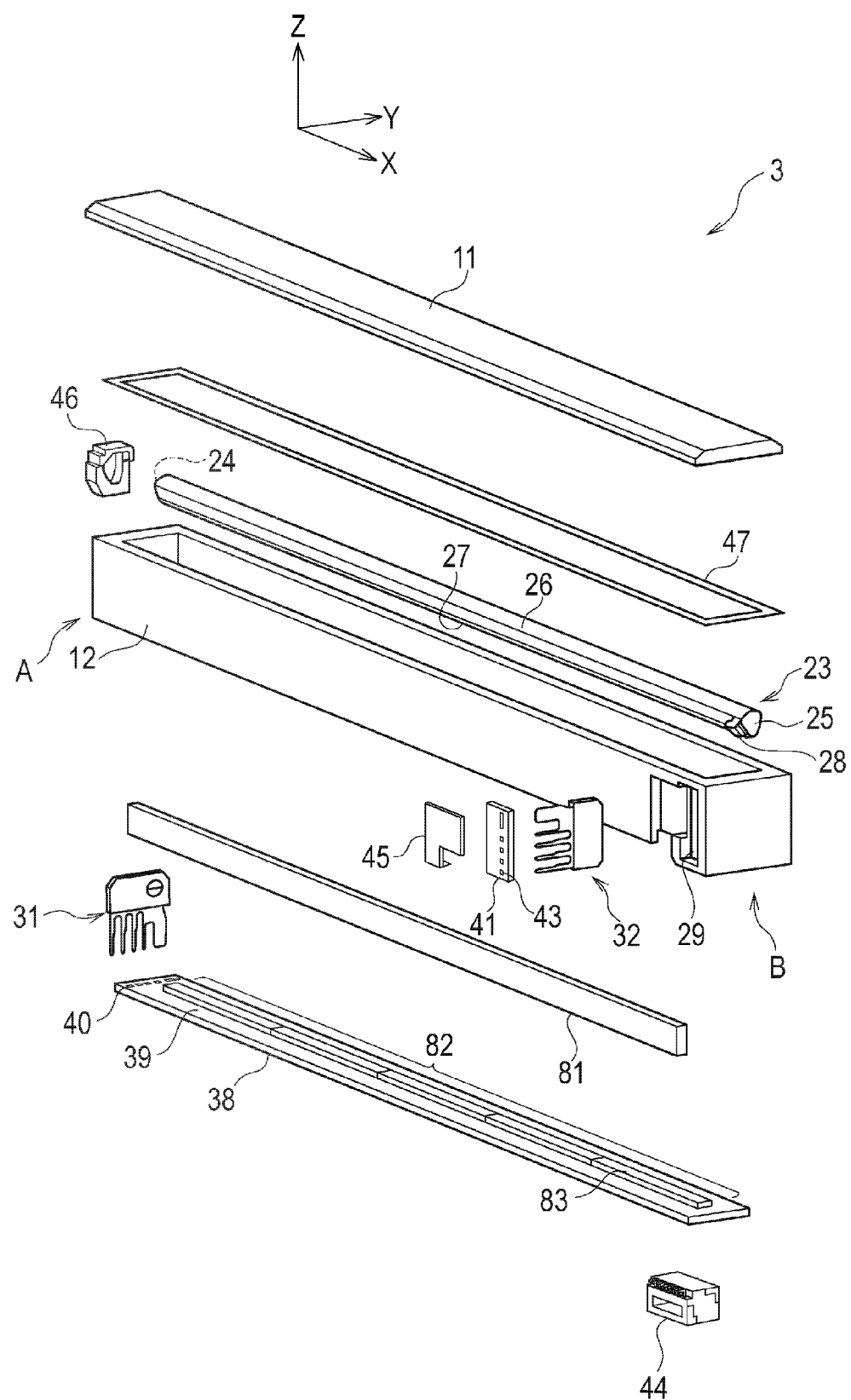
FIG. 12 is an exploded perspective view of the image sensor unit according to the present embodiments.
Figure 17:
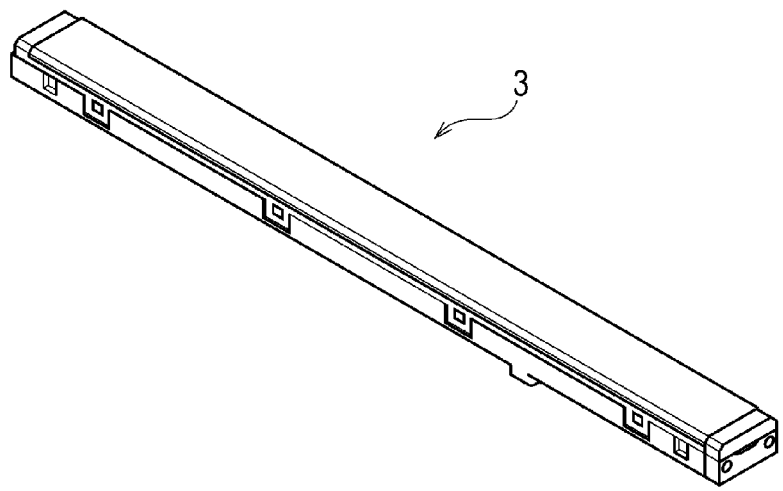
FIG. 17 is a perspective view of the image sensor unit according to the present embodiments.

FIG. 17 is a perspective view of the image sensor unit 3. FIG. 11 is a sectional view of the image sensor unit 3. FIG. 12 is an exploded perspective view illustrating constituent members of the image sensor unit 3. As illustrated in FIG. 11 and FIG. 12, the image sensor unit 3 includes a light condenser 81 and an image sensor 82.

The light condenser 81 is an optical member that images the reflection light from the original P on the image sensor 82 and is held by the frame 12. The light condenser 81 can be, for example, a rod-lens array including a plurality of image elements (rod lenses) of an erect equal magnification imaging type linearly arranged in the main-scan direction.

The image sensor 82 is mounted on the mounting surface 39 of the first circuit board 38 and is arranged in the lower direction of the light condenser 81. In the image sensor 82, image sensor ICs 83 including a plurality of light receiving elements corresponding to the resolution of reading of the image sensor unit 3 are linearly mounted on the first circuit board 38 in the main-scan direction. The image sensor 82 converts reflection light reflected from the original P and imaged by the light condenser 81 to an electric signal. Other than the implementation of the image sensor 82 on the first circuit board 38, a substrate for mounting the image sensor 82 may be arranged above the first circuit board 38, for example.

In the image sensor unit 3 with the configuration described above, the first light source 31 and the second light source 32 arranged in the frame 12 are turned on to emit light for reflection reading indicated by an arrow L3, from the light guide 23 to the lower surface of the original P. Therefore, the light is linearly emitted to the original P throughout the reading line S (main-scan direction). The light is reflected by the original P, and reflection light is imaged on the image sensor 82 through the light condenser 81. The image sensor 82 can convert the imaged reflection light to an electric signal to read the image on the lower surface of the original P.

The image sensor 82 reads the reflection light of one scan line, and the reading operation of one scan line in the main-scan direction of the original P is completed. After the completion of the reading operation of one scan line, reading operation of the next scan line is performed in the same way as the operation described above, along with relative movement of the original P in the sub-scan direction. In this way, the image sensor unit 3 repeats the reading operation of one scan line while moving in the sub-scan direction. The entire surface of the original P is successively scanned, and the image is read based on the reflection light.

In the illumination apparatus 50 of the image sensor unit 3, the first light source 31 and the second light source 32 are set so that the width directions of the light emitting surfaces 35 are orthogonal to each other when viewed in the main-scan direction as in the first embodiment. Therefore, the dimension of the combination of the first light source 31 and the second light source 32 in the sub-scan direction can be reduced. Therefore, the image sensor unit 3, the image reading apparatus, and the image forming apparatus can be downsized.

Although the embodiments are used to describe the present invention, the present invention is not limited only to the embodiments, and changes can be made within the scope of the present invention.

For example, although the LED module 33 with three LED chips 36 arranged in the sub-scan direction is used for the first light source 31 and the second light source 32 of the embodiments, the arrangement is not limited to this, and any light source with one or more LED chips may be used. For example, when an LED module provided with two LED chips 36 is used, the width direction of the first light source 31 and the width direction of the second light source 32 may be rotated 90° so that the center position of two LED chips of the first light source 31 and the center position of two LED chips of the second light source 32 coincide when viewed in the main-scan direction. When an LED module with three LED chips arranged in a triangular shape is used for example, the width direction of the first light source 31 and the width direction of the second light source 32 may be rotated 90° so that the center of gravity (center position) of the triangle of the three LED chips of the first light source 31 and the center of gravity (center position) of the triangle of the three LED chips of the second light source 32 coincide when viewed in the main-scan direction.

Although the depression 48 provided on the light emitting surface 35 of the first light source 31 and the second light source 32 is an octagon in the embodiments, the shape of the depression 48 is not limited to the octagon, and the shape can be any shape, such as a rectangle and a circle.

Although the terminal of the first light source 31 and the terminal of the second light source 32 are orthogonal to each other (90°) in the embodiments, the angle between the terminal of the first light source 31 and the terminal of the second light source 32 is not limited to the orthogonal (90°). The angle between the terminal of the first light source 31 and the terminal of the second light source 32 may be any angle if the protrusion length in a predetermined direction is reduced by changing the angle between the terminal of the first light source 31 and the terminal of the second light source 32, wherein when viewed in the longitudinal direction of the light guide 23, the first light source 31 is arranged closer to one end of the light guide 23 in the longitudinal direction so that the light emitting portion of the first light source 31 is arranged in the one end face of the light guide 23, and the second light source 32 is arranged closer to the other end of the light guide 23 in the longitudinal direction so that the light emitting portion of the second light source 32 is arranged in the other end face of the light guide 23.

Furthermore, the angle between the terminal of the first light source 31 and the terminal of the second light source 32 may be any angle if the protrusion length in a predetermined direction is reduced by changing the angle between the terminal of the first light source 31 and the terminal of the second light source 32, wherein when viewed in the longitudinal direction of the light guide 23, the first light source 31 is arranged closer to one end of the light guide 23 in the longitudinal direction so that the depression 48 of the light emitting surface 35 of the first light source 31 is arranged in the one end face of the light guide 23, and the second light source 32 is arranged closer to the other end of the light guide 23 in the longitudinal direction so that the depression 48 of the light emitting surface 35 of the second light source 32 is arranged in the other end face of the light guide 23. As a result, the dimension of the combination of the first light source 31 and the second light source 32 in the predetermined direction can be reduced.

Figure 18A:
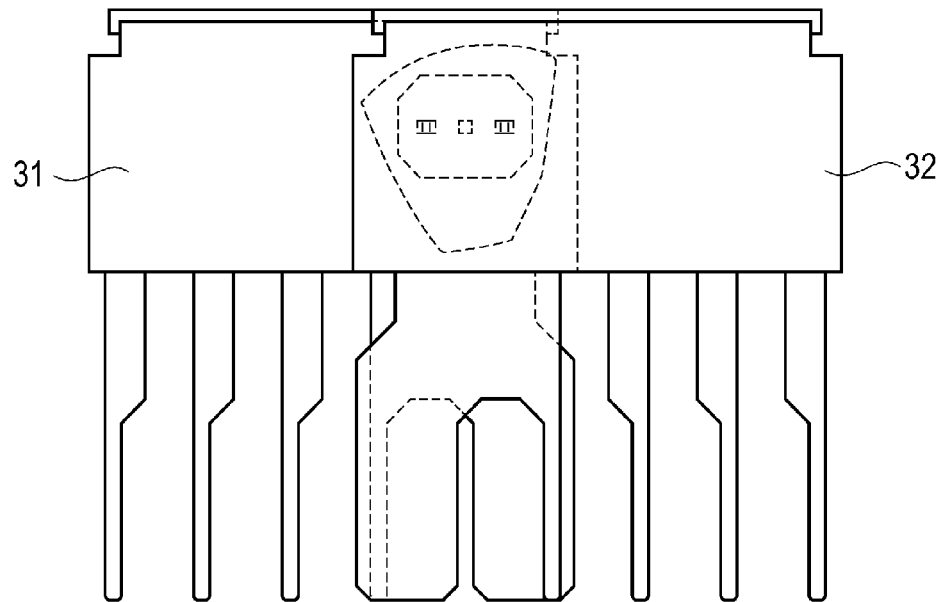
FIG. 18A is a view from a longitudinal direction of a light guide when an angle between a terminal of a first light source and a terminal of a second light source is 0° (comparative example)
Figure 18B:
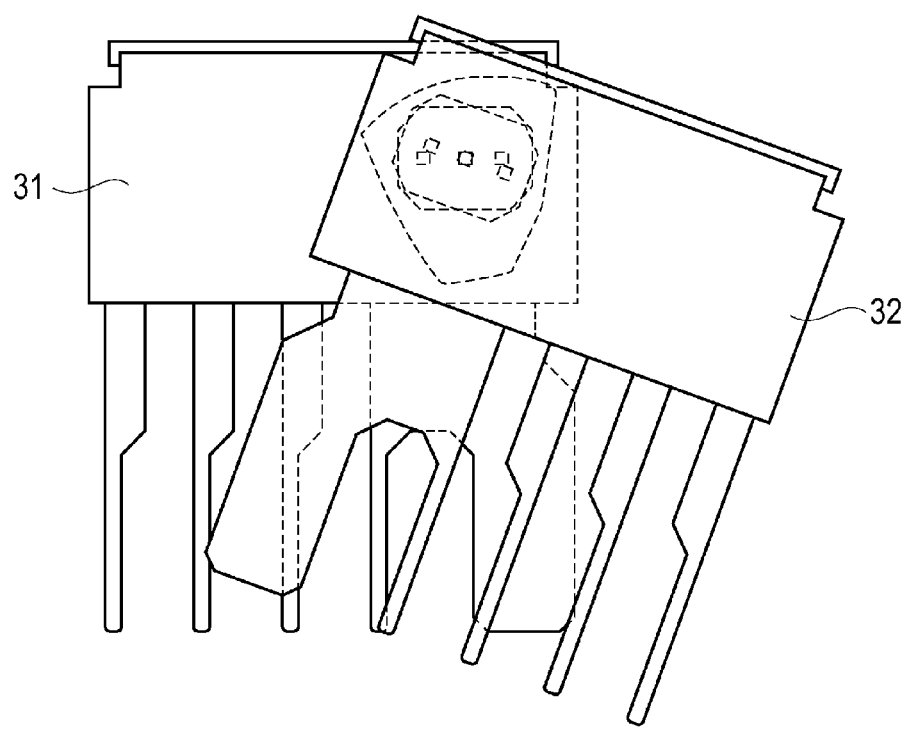
FIG. 18B is a view from the longitudinal direction of the light guide when the angle between the terminal of the first light source and the terminal of the second light source is 21.2°.
Figure 18C:
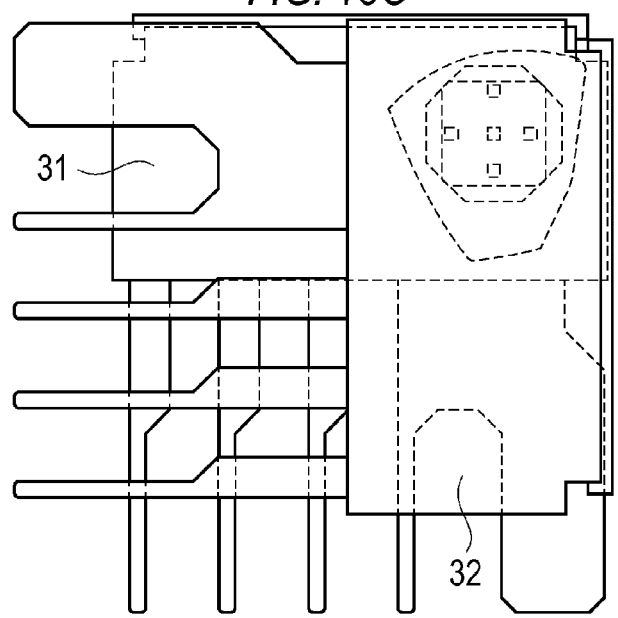
FIG. 18C is a view from the longitudinal direction of the light guide when the angle between the terminal of the first light source and the terminal of the second light source is 90° (orthogonal)
Figure 18D:
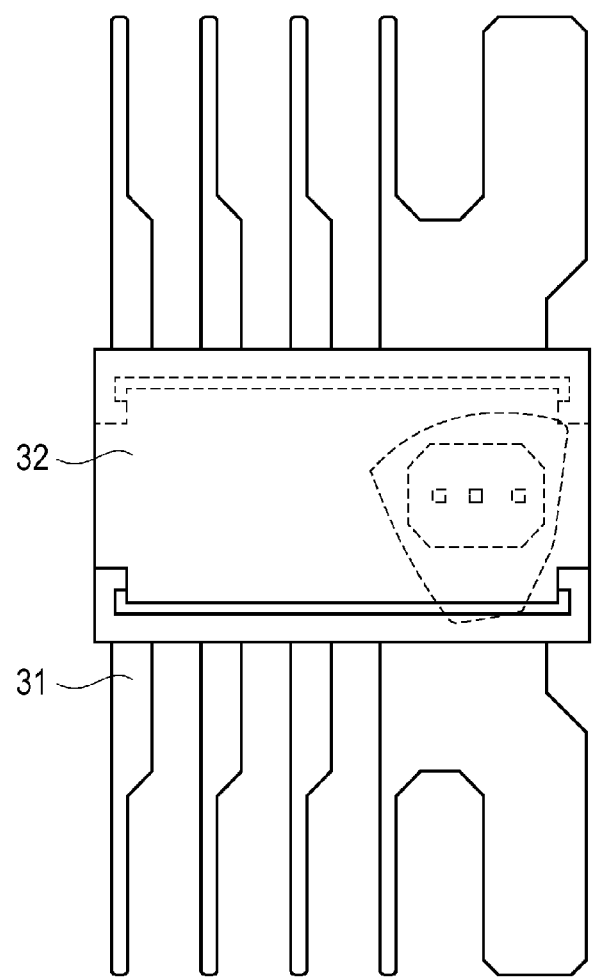
FIG. 18D is a view from the longitudinal direction of the light guide when the angle between the terminal of the first light source and the terminal of the second light source is 180°.
Figure 18E:
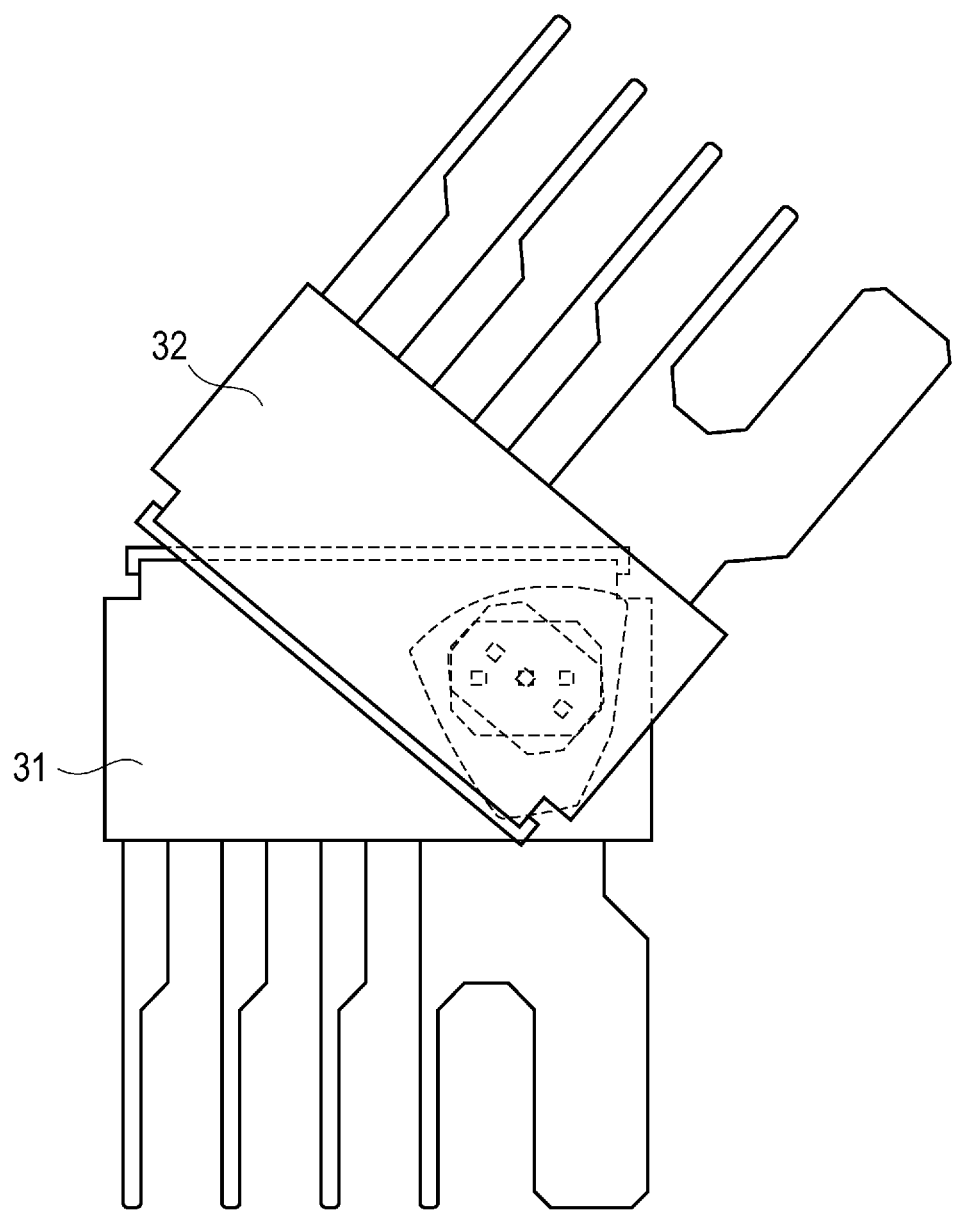
FIG. 18E is a view from the longitudinal direction of the light guide when the angle between the terminal of the first light source and the terminal of the second light source is 220.2°.
Figure 18F:
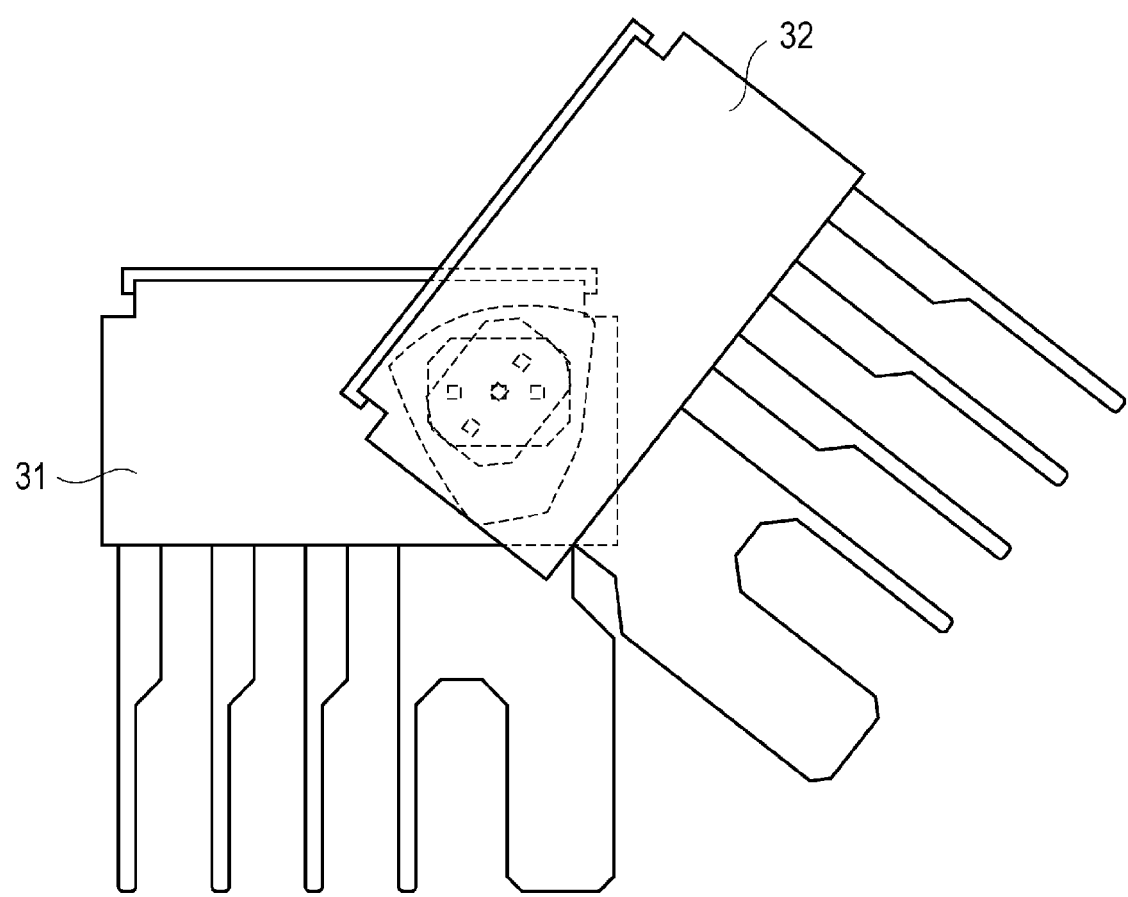
FIG. 18F is a view from the longitudinal direction of the light guide when the angle between the terminal of the first light source and the terminal of the second light source is 307.7°.

FIG. 18A to FIG. 18F are views of the light guide 23 in the longitudinal direction when the terminal of the first light source 31 and the terminal of the second light source 32 are changed at various angles in the light sources according to the present embodiments. FIG. 18A is a view in which the angle between the terminal of the first light source 31 and the terminal of the second light source 32 is 0° (comparative example). FIG. 18B is a view in which the angle between the terminal of the first light source 31 and the terminal of the second light source 32 is 21.2°. FIG. 18C is a view in which the angle between the terminal of the first light source 31 and the terminal of the second light source 32 is 90° (orthogonal). FIG. 18D is a view in which the angle between the terminal of the first light source 31 and the terminal of the second light source 32 is 180°. FIG. 18E is a view in which the angle between the terminal of the first light source 31 and the terminal of the second light source 32 is 220.2°. FIG. 18F is a view in which the angle between the terminal of the first light source 31 and the terminal of the second light source 32 is 307.7°. If the angle between the terminal of the first light source 31 and the terminal of the second light source 32 is in a range of 21.2° to 220.2°, the length in the sub-scan direction can be reduced in the light sources of the present embodiments, compared to when the angle is not changed. As a result, the dimension of the combination of the first light source 31 and the second light source 32 in a predetermined direction can be reduced. In the light sources of the present embodiments, the dimension in the sub-scan direction is the smallest when the angle between the terminal of the first light source 31 and the terminal of the second light source 32 is 90°, and the sub-scan direction can be 2.9 (mm) shorter than that of the comparative example.

Although the LED modules 33 with the same outer shape and configuration are used for the first light source 31 and the second light source 32 according to the present embodiments, the arrangement is not limited to this. For example, the first light source and the second light source may be applied to a combination of light sources with light emitting portions deviated closer to one side in the width direction by different distances from the center positions of the light sources in the width direction.

Figure 13:
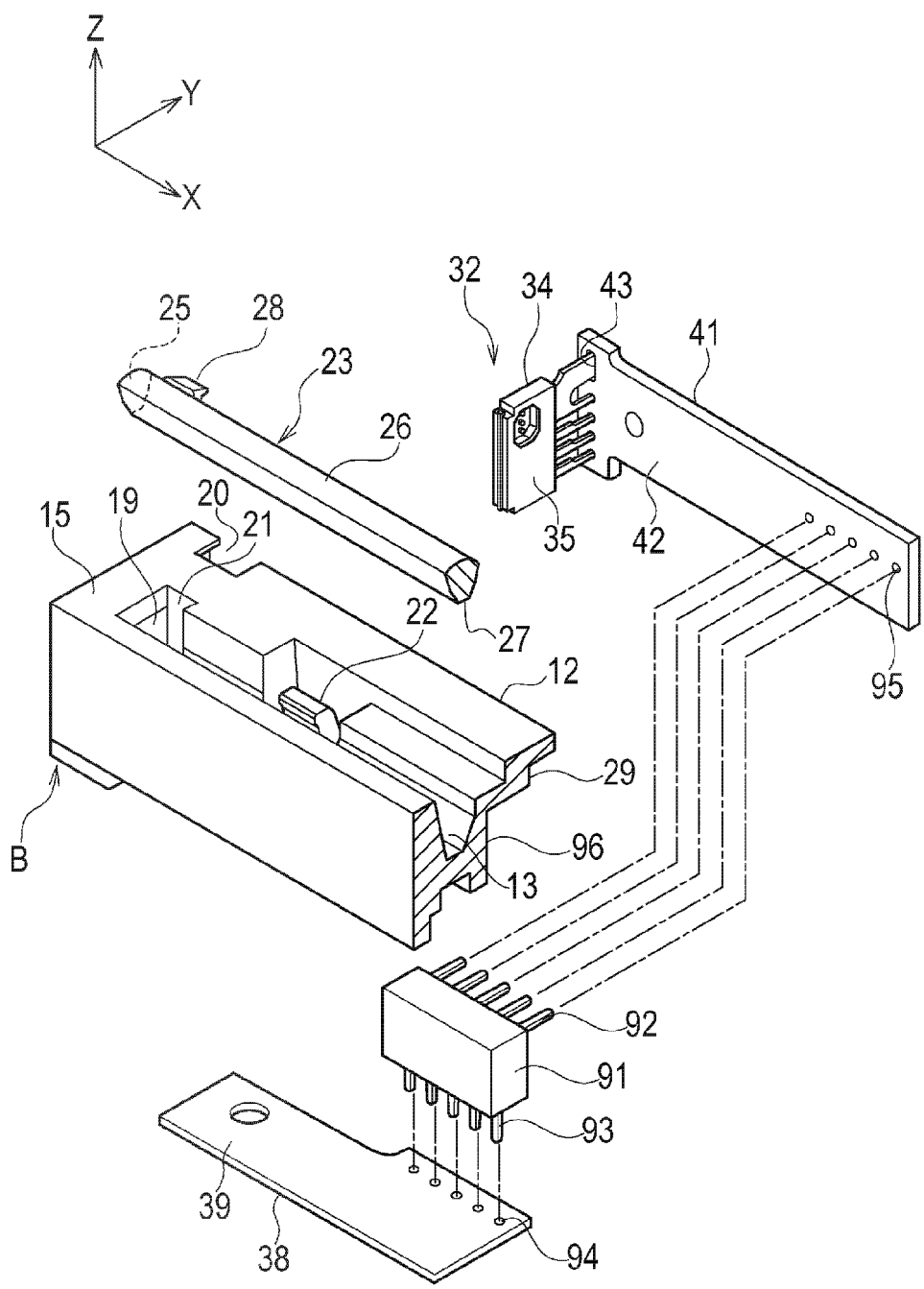
FIG. 13 is a view illustrating another mode of connecting circuit boards according to the present embodiments.
Figure 14:
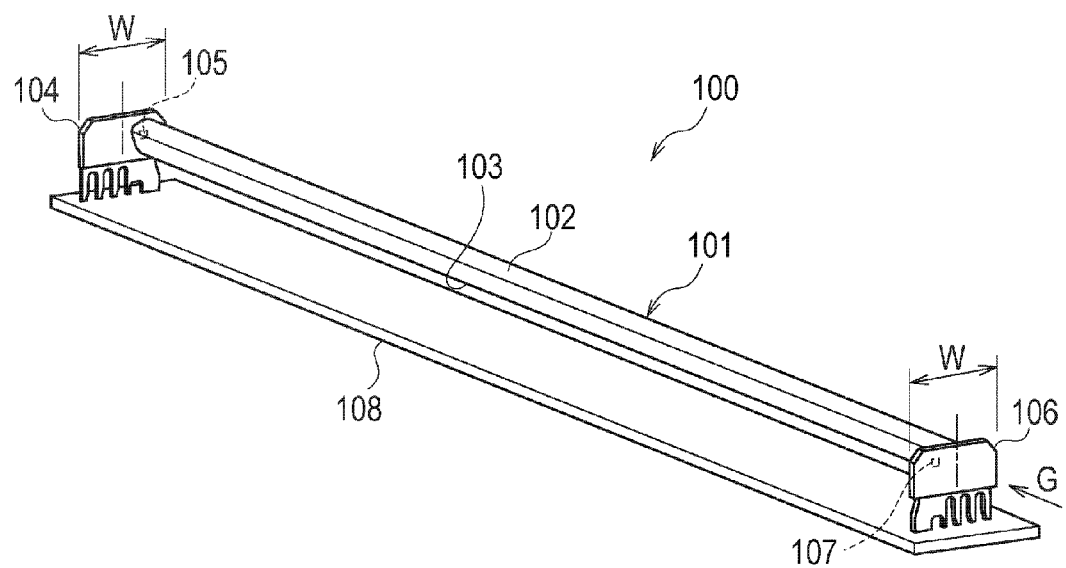
FIG. 14 is a perspective view illustrating an arrangement of an illumination apparatus of a comparative example.

Although the first circuit board 38 and the second circuit board 41 are connected through the flexible substrate 45 in the embodiments, the arrangement is not limited to this. FIG. 13 is a view illustrating another mode of connecting the first circuit board 38 and the second circuit board 41. The same components as those of FIG. 5B are designated with the same reference numerals in FIG. 13, and the description will not be repeated. As illustrated in FIG. 13, the first circuit board 38 and the second circuit board 41 may be connected through a connector 91. The connector 91 includes: terminals 93 inserted to insertion holes 94 drilled on the mounting surface 39 of the first circuit board 38; and terminals 92 inserted to insertion holes 95 drilled on the mounting surface 42 of the second circuit board 41. Further inside of the frame 12 than the second board housing portion 29, the frame 12 is provided with a connector housing portion 96 for arranging the connector 91. The connector 91 connecting the first circuit board 38 and the second circuit board 41 is arranged in the connector housing portion 96 when assembled on the frame 12.

The present invention can be effectively used for an illumination apparatus, for an image sensor unit to which the illumination apparatus is applied, and for an image reading apparatus and an image forming apparatus to which the image sensor unit is applied (for example, image scanner, facsimile, copying machine, and compound machine).

The present invention realizes an illumination apparatus with a reduced protrusion length in a predetermined direction and realizes an image sensor unit, an image reading apparatus, and a paper sheet discriminating apparatus using the illumination apparatus.

It should be noted that the above embodiments merely illustrate concrete examples of implementing the present invention, and the technical scope of the present invention is not to be construed in a restrictive manner by these embodiments. That is, the present invention may be implemented in various forms without departing from the technical spirit or main features thereof.

What is claimed is:

1. An illumination apparatus that illuminates an illuminated body, the illumination apparatus comprising:
   a first light source comprising: a first light emitting portion that emits light; a first supporting body that supports the first light emitting portion at a position displaced closer to one side of the first supporting body; and a first terminal protruding from the first supporting body;
   a second light source comprising: a second light emitting portion that emits light; a second supporting body that supports the second light emitting portion at a position displaced closer to the one side that is the same as the first light emitting portion included in the first light source; and a second terminal protruding from the second supporting body in a same direction as a direction of the protrusion of the first terminal from the first supporting body; and
   a light guide that guides the light from the first light source and the second light source to the illuminated body, wherein
   the first light source is arranged closer to one end of the light guide in a longitudinal direction so that the first light emitting portion of the first light source is arranged in one end face of the light guide when viewed in the longitudinal direction of the light guide, the second light source is arranged closer to another end of the light guide in the longitudinal direction so that the second light emitting portion of the second light source is arranged in another end face of the light guide when viewed in the longitudinal direction of the light guide, the first light source and the second light source are arranged so that the protrusion direction of the first terminal from the first supporting body and the protrusion direction of the second terminal from the second supporting body are different when viewed in the longitudinal direction of the light guide, and the first light source and the second light source are arranged so that a protrusion length of the first supporting body and the second supporting body in a predetermined direction from an area where the first light source and the second light source overlap when viewed in the longitudinal direction of the light guide is smaller than when the protrusion direction of the first terminal from the first supporting body and the protrusion direction of the second terminal from the second supporting body are the same.

2. The illumination apparatus according to claim 1, further comprising:
a main circuit board electrically connected to the first light source; and
an auxiliary circuit board electrically connected to the second light source and electrically connected to the main circuit board.

3. The illumination apparatus according to claim 1, wherein
the first supporting body further comprises a first depression, the first light emitting portion is provided in the first depression,
the first light source is arranged closer to the one end of the light guide in the longitudinal direction so that the first depression is arranged in the one end face of the light guide when viewed in the longitudinal direction of the light guide,
the second supporting body comprises a second depression, the second light emitting portion is provided in the second depression, and
the second light source is arranged closer to the other end of the light guide in the longitudinal direction so that the second depression is arranged in the other end face of the light guide when viewed in the longitudinal direction of the light guide.

4. The illumination apparatus according to claim 2, wherein
the main circuit board and the auxiliary circuit board are connected by a flexible substrate or a connector.

5. The illumination apparatus according to claim 1, wherein
the first light source comprises a plurality of first light emitting portions,
the second light source comprises a plurality of second light emitting portions, and
the first light source and the second light source are arranged so that a first light emitting portion positioned at a center of the plurality of first light emitting portions and a second light emitting portion positioned at a center of the plurality of second light emitting portions overlap when viewed in the longitudinal direction of the light guide.

6. The illumination apparatus according to claim 1, wherein the first supporting body and the second supporting body are plate-like rectangular solids, and the first supporting body and the second supporting body are arranged orthogonal to each other when viewed in the longitudinal direction of the light guide.

7. The illumination apparatus according to claim 2, wherein
the main circuit board and the auxiliary circuit board are arranged orthogonal to each other.

8. The illumination apparatus according to claim 1, wherein
a shape of the second supporting body is the same as a shape of the first supporting body,
a shape of the second terminal is the same as a shape of the first terminal, and
an arrangement of the second light emitting portion in the second supporting body is the same as an arrangement of the first light emitting portion in the first supporting body.

9. The illumination apparatus according to claim 1, wherein the one side of the first supporting body is the one side in a width direction of the first supporting body.

10. An image sensor unit comprising:
an illumination apparatus comprising:
a first light source comprising: a first light emitting portion that emits light; a first supporting body that supports the first light emitting portion at a position displaced closer to one side of the first supporting body; and a first terminal protruding from the first supporting body;
a second light source comprising: a second light emitting portion that emits light; a second supporting body that supports the second light emitting portion at a position displaced closer to the one side that is the same as the first light emitting portion included in the first light source; and a second terminal protruding from the second supporting body in a same direction as a direction of the protrusion of the first terminal from the first supporting body; and
a light guide that guides the light from the first light source and the second light source to an illuminated body, wherein
the first light source is arranged closer to one end of the light guide in a longitudinal direction so that the first light emitting portion of the first light source is arranged in one end face of the light guide when viewed in the longitudinal direction of the light guide,
the second light source is arranged closer to another end of the light guide in the longitudinal direction so that the second light emitting portion of the second light source is arranged in another end face of the light guide when viewed in the longitudinal direction of the light guide,
the first light source and the second light source are arranged so that the protrusion direction of the first terminal from the first supporting body and the protrusion direction of the second terminal from the second supporting body are different when viewed in the longitudinal direction of the light guide, and
the first light source and the second light source are arranged so that a protrusion length of the first supporting body and the second supporting body in a predetermined direction from an area where the first light source and the second light source overlap when viewed in the longitudinal direction of the light guide is smaller than when the protrusion direction of the first terminal from the first supporting body and the protrusion direction of the second terminal from the second supporting body are the same;

a light condenser that images reflection light from the illuminated body generated by illumination of the illuminated body by the light guide; and an image sensor that receives the light imaged by the light condenser to convert the light to an electric signal.

11. The image sensor unit according to claim 10, wherein the illumination apparatus further comprises:

a main circuit board electrically connected to the first light source; and an auxiliary circuit board electrically connected to the second light source and electrically connected to the main circuit board.

12. The image sensor unit according to claim 10, wherein the first supporting body further comprises:

a first depression, the first light emitting portion is provided in the first depression, the first light source is arranged closer to the one end of the light guide in the longitudinal direction so that the first depression is arranged in the one end face of the light guide when viewed in the longitudinal direction of the light guide, the second supporting body comprises a second depression, the second light emitting portion is provided in the second depression, and the second light source is arranged closer to the other end of the light guide in the longitudinal direction so that the second depression is arranged in the other end face of the light guide when viewed in the longitudinal direction of the light guide.

13. A paper sheet discriminating apparatus that discriminates a paper sheet as an illuminated body, the paper sheet discriminating apparatus comprising:

an illumination apparatus comprising:

a first light source comprising: a first light emitting portion that emits light; a first supporting body that supports the first light emitting portion at a position displaced closer to one side of the first supporting body; and a first terminal protruding from the first supporting body;

a second light source comprising: a second light emitting portion that emits light; a second supporting body that supports the second light emitting portion at a position displaced closer to the one side that is the same as the first light emitting portion included in the first light source; and a second terminal protruding from the second supporting body in a same direction as a direction of the protrusion of the first terminal from the first supporting body; and a light guide that guides the light from the first light source and the second light source to the paper sheet, wherein the first light source is arranged closer to one end of the light guide in a longitudinal direction so that the first light emitting portion of the first light source is arranged in one end face of the light guide when viewed in the longitudinal direction of the light guide, the second light source is arranged closer to another end of the light guide in the longitudinal direction so that the second light emitting portion of the second light source is arranged in another end face of the light guide when viewed in the longitudinal direction of the light guide, the first light source and the second light source are arranged so that the protrusion direction of the first terminal from the first supporting body and the protrusion direction of the second terminal from the second supporting body are different when viewed in the longitudinal direction of the light guide, and the first light source and the second light source are arranged so that a protrusion length of the first supporting body and the second supporting body in a predetermined direction from an area where the first light source and the second light source overlap when viewed in the longitudinal direction of the light guide is smaller than when the protrusion direction of the first terminal from the first supporting body and the protrusion direction of the second terminal from the second supporting body are the same;

an image sensor unit comprising: a light source that emits light; a light guide that guides the light from the light source to the paper sheet; a light condenser that images reflection light from the paper sheet generated by illumination of a first surface of the paper sheet by the light guide and that images transmitted light that has transmitted through the paper sheet generated by illumination of a second surface of the paper sheet by the illumination apparatus; and an image sensor that receives the light imaged by the light condenser to convert the light to an electric signal;

conveying means for conveying the paper sheet;

storing means for storing reference data as a reference for discriminating the paper sheet; and discriminating means for comparing image data corresponding to the electric signal with the reference data stored in the storing means to discriminate the paper sheet.

14. The paper sheet discriminating apparatus according to claim 13, wherein the illumination apparatus further comprises:

a main circuit board electrically connected to the first light source; and an auxiliary circuit board electrically connected to the second light source and electrically connected to the main circuit board.

15. The paper sheet discriminating apparatus according to claim 13, wherein the first supporting body further comprises a first depression, the first light emitting portion is provided in the first depression, the first light source is arranged closer to the one end of the light guide in the longitudinal direction so that the first depression is arranged in the one end face of the light guide when viewed in the longitudinal direction of the light guide, the second supporting body comprises a second depression, the second light emitting portion is provided in the second depression, and the second light source is arranged closer to the other end of the light guide in the longitudinal direction so that the second depression is arranged in the other end face of the light guide when viewed in the longitudinal direction of the light guide.

* * * * *